United States Patent
Lin et al.

(10) Patent No.: US 9,263,412 B2
(45) Date of Patent: Feb. 16, 2016

(54) PACKAGING METHODS AND PACKAGED SEMICONDUCTOR DEVICES

(71) Applicant: Taiwan Semiconductor Manufacturing Company, Ltd., Hsin-Chu (TW)

(72) Inventors: Wei-Hung Lin, Xinfeng Township (TW); Ming-Da Cheng, Jhubei (TW); Chung-Shi Liu, Hsin-Chu (TW); Wei-Yu Chen, Taipei (TW); Hsiu-Jen Lin, Zhubei (TW); Kuei-Wei Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/473,435

(22) Filed: Aug. 29, 2014

(65) Prior Publication Data

US 2014/0367867 A1    Dec. 18, 2014

Related U.S. Application Data

(60) Continuation-in-part of application No. 14/265,164, filed on Apr. 29, 2014, which is a division of application No. 13/416,805, filed on Mar. 9, 2012, now abandoned.

(51) Int. Cl.
*H01L 23/00* (2006.01)
*H01L 25/00* (2006.01)
(Continued)

(52) U.S. Cl.
CPC ................ *H01L 24/17* (2013.01); *B23K 35/24* (2013.01); *B23K 35/3612* (2013.01);
(Continued)

(58) Field of Classification Search
None
See application file for complete search history.

(56) References Cited

U.S. PATENT DOCUMENTS 5,424,251 A    6/1995  Sono
5,914,536 A    6/1999  Shizuki et al.
(Continued)

FOREIGN PATENT DOCUMENTS

CN    101894772 A    11/2010
CN    101958261 A     1/2011
CN    102097397 A     6/2011

OTHER PUBLICATIONS

"Epoxy Flux Stealing Tacky Flux's Limelight?," by the Henkel Corporation, Jul. 2, 2009, 1 page.
Lee, "Epoxy Flux-A Low Cost High Reliability Approach for PoP Assembly," http://www.slideshare.net/nclee715epoxy-flux-a-low-cost-high-reliability-approach-for-pop-assemblyimaps-2011 # on Oct. 28, 2011, 8 pages.
Johnson, R.W., "Flip Chip Assembly and Underfilling," Taken from Chapter 19 of Handbook of Area Array Packaging, published by McGraw Hill Professional, 2001, 58 pages.

*Primary Examiner* — Evren Seven
(74) *Attorney, Agent, or Firm* — Slater & Matsil, L.L.P.

(57) ABSTRACT

An embodiment is a method including forming a first package and a second package. The first package includes packaging a first die, forming a plurality of solder balls on the first die, and coating the plurality of solder balls with an epoxy flux. The second package includes forming a first electrical connector, attaching a second die adjacent the first electrical connector, forming a interconnect structure over the first die and the first electrical connector, the interconnect structure being a frontside of the second package, forming a second electrical connector over the interconnect structure, and the second electrical connector being coupled to both the first die and the first electrical connector. The method further includes bonding the first package to the backside of the second package with the plurality of solder balls forming a plurality of solder joints, each of the plurality of solder joints being surrounded by the epoxy flux.

19 Claims, 23 Drawing Sheets

(51) Int. Cl.
  *H01L 21/768* (2006.01)
  *B23K 35/36* (2006.01)
  *B23K 35/24* (2006.01)
  *H01L 23/498* (2006.01)
  *H01L 25/10* (2006.01)
  *H01L 23/31* (2006.01)
  *H01L 21/00* (2006.01)
  *H01L 23/29* (2006.01)
  *H01L 25/065* (2006.01)

(52) U.S. Cl.
  CPC ..... *H01L 21/76895* (2013.01); *H01L 23/3128* (2013.01); *H01L 23/49816* (2013.01); *H01L 24/19* (2013.01); *H01L 24/25* (2013.01); *H01L 24/82* (2013.01); *H01L 25/105* (2013.01); *H01L 25/50* (2013.01); *H01L 23/295* (2013.01); *H01L 24/05* (2013.01); *H01L 24/11* (2013.01); *H01L 24/13* (2013.01); *H01L 24/16* (2013.01); *H01L 24/32* (2013.01); *H01L 25/0657* (2013.01); *H01L 2224/0401* (2013.01); *H01L 2224/05009* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/05684* (2013.01); *H01L 2224/1145* (2013.01); *H01L 2224/11452* (2013.01); *H01L 2224/11462* (2013.01); *H01L 2224/12105* (2013.01); *H01L 2224/13082* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13184* (2013.01); *H01L 2224/16237* (2013.01); *H01L 2224/2518* (2013.01); *H01L 2224/32145* (2013.01); *H01L 2224/32225* (2013.01); *H01L 2224/45144* (2013.01); *H01L 2224/45147* (2013.01); *H01L 2224/48091* (2013.01); *H01L 2224/48228* (2013.01); *H01L 2224/48644* (2013.01); *H01L 2224/48647* (2013.01); *H01L 2224/48655* (2013.01); *H01L 2224/48666* (2013.01); *H01L 2224/48671* (2013.01); *H01L 2224/48684* (2013.01); *H01L 2224/48844* (2013.01); *H01L 2224/48847* (2013.01); *H01L 2224/48855* (2013.01); *H01L 2224/48866* (2013.01); *H01L 2224/48871* (2013.01); *H01L 2224/48884* (2013.01); *H01L 2224/73204* (2013.01); *H01L 2224/73265* (2013.01); *H01L 2224/81815* (2013.01); *H01L 2225/0651* (2013.01); *H01L 2225/06568* (2013.01); *H01L 2225/1023* (2013.01); *H01L 2225/1035* (2013.01); *H01L 2225/1058* (2013.01); *H01L 2225/1082* (2013.01); *H01L 2225/1088* (2013.01); *H01L 2924/0665* (2013.01); *H01L 2924/15311* (2013.01); *H01L 2924/15331* (2013.01); *H01L 2924/181* (2013.01); *H01L 2924/18161* (2013.01)

(56) References Cited

U.S. PATENT DOCUMENTS

| | | | |
|---|---|---|---|
| 6,028,357 A | 2/2000 | Moriyama | |
| 6,235,554 B1* | 5/2001 | Akram et al. | 438/109 |
| 6,303,997 B1 | 10/2001 | Lee | |
| 6,642,136 B1 | 11/2003 | Lee et al. | |
| 6,646,353 B1 | 11/2003 | Lopatin | |
| 6,646,356 B1 | 11/2003 | Whalen et al. | |
| 6,680,217 B2 | 1/2004 | Whalen et al. | |
| 6,791,195 B2 | 9/2004 | Urushima | |
| 7,145,225 B2 | 12/2006 | Lee | |
| 7,189,593 B2 | 3/2007 | Lee | |
| 7,198,980 B2 | 4/2007 | Jiang et al. | |
| 7,345,361 B2 | 3/2008 | Mallik et al. | |
| 7,446,420 B1 | 11/2008 | Kim | |
| 7,528,007 B2 | 5/2009 | Fee et al. | |
| 7,528,474 B2 | 5/2009 | Lee | |
| 7,550,832 B2 | 6/2009 | Weng et al. | |
| 7,573,136 B2 | 8/2009 | Jiang | |
| 7,576,413 B2* | 8/2009 | Ishihara et al. | 257/621 |
| 7,674,651 B2 | 3/2010 | Oyama et al. | |
| 7,749,888 B2 | 7/2010 | Nishiyama | |
| 7,820,543 B2 | 10/2010 | Chang et al. | |
| 7,863,727 B2 | 1/2011 | Lake | |
| 7,964,952 B2 | 6/2011 | Lee | |
| 7,969,004 B2 | 6/2011 | Ohnishi | |
| 8,004,074 B2 | 8/2011 | Mori et al. | |
| 8,018,043 B2 | 9/2011 | Suh et al. | |
| 8,076,787 B2 | 12/2011 | Hayashi | |
| 8,125,065 B2 | 2/2012 | Lee | |
| 8,143,710 B2 | 3/2012 | Cho | |
| 8,169,064 B2 | 5/2012 | Kim | |
| 8,178,984 B2 | 5/2012 | Corisis et al. | |
| 8,269,326 B2 | 9/2012 | Lee | |
| 8,299,595 B2 | 10/2012 | Yoon et al. | |
| 8,300,423 B1 | 10/2012 | Darveaux et al. | |
| 8,304,900 B2 | 11/2012 | Jang et al. | |
| 8,334,171 B2 | 12/2012 | Pagaila et al. | |
| 8,390,108 B2 | 3/2013 | Cho et al. | |
| 8,405,197 B2 | 3/2013 | Ha et al. | |
| 8,409,920 B2 | 4/2013 | Pendse et al. | |
| 8,421,245 B2 | 4/2013 | Gonzalez et al. | |
| 8,431,478 B2 | 4/2013 | Shen | |
| 8,456,856 B2* | 6/2013 | Lin et al. | 361/783 |
| 8,546,945 B2 | 10/2013 | Kuo et al. | |
| 8,633,100 B2 | 1/2014 | Yang et al. | |
| 8,669,173 B2 | 3/2014 | Lee | |
| 8,723,302 B2 | 5/2014 | Chandra et al. | |
| 8,895,440 B2* | 11/2014 | Choi et al. | 438/675 |
| 2001/0054771 A1 | 12/2001 | Wark et al. | |
| 2004/0262774 A1 | 12/2004 | Kang et al. | |
| 2006/0113681 A1 | 6/2006 | Jeong et al. | |
| 2006/0220259 A1 | 10/2006 | Chen et al. | |
| 2007/0200234 A1 | 8/2007 | Gerber et al. | |
| 2009/0085185 A1 | 4/2009 | Byun et al. | |
| 2009/0091015 A1 | 4/2009 | Shen et al. | |
| 2009/0098731 A1* | 4/2009 | Gan et al. | 438/667 |
| 2009/0115044 A1 | 5/2009 | Hoshino et al. | |
| 2009/0206461 A1 | 8/2009 | Yoon | |
| 2009/0243072 A1 | 10/2009 | Ha et al. | |
| 2010/0102444 A1 | 4/2010 | Khor et al. | |
| 2010/0140779 A1 | 6/2010 | Lin et al. | |
| 2010/0171207 A1 | 7/2010 | Shen et al. | |
| 2010/0244223 A1 | 9/2010 | Cho et al. | |
| 2011/0068453 A1* | 3/2011 | Cho et al. | 257/686 |
| 2011/0128711 A1 | 6/2011 | Yim et al. | |
| 2011/0241218 A1* | 10/2011 | Meyer et al. | 257/774 |
| 2011/0256662 A1 | 10/2011 | Yamano et al. | |
| 2012/0032341 A1 | 2/2012 | Chao et al. | |
| 2012/0043655 A1 | 2/2012 | Khor et al. | |
| 2012/0104624 A1* | 5/2012 | Choi et al. | 257/774 |
| 2012/0217629 A1* | 8/2012 | Cho et al. | 257/692 |
| 2012/0217642 A1 | 8/2012 | Sun | |
| 2012/0252163 A1* | 10/2012 | Yoo et al. | 438/107 |
| 2012/0326324 A1* | 12/2012 | Lee | H01L 21/568 257/774 |
| 2013/0128485 A1 | 5/2013 | Lu | |
| 2013/0147043 A1 | 6/2013 | Gonzalez et al. | |
| 2013/0285237 A1 | 10/2013 | Yu et al. | |
| 2013/0285238 A1 | 10/2013 | Chen et al. | |
| 2013/0292846 A1* | 11/2013 | Lee et al. | 257/774 |
| 2014/0124928 A1 | 5/2014 | Lin et al. | |

(56) References Cited

U.S. PATENT DOCUMENTS

| | | |
|---|---|---|
| 2014/0124937 A1 | 5/2014 | Wu |
| 2014/0367848 A1 * | 12/2014 | Chi et al. .............. 257/737 |
| 2014/0374902 A1 * | 12/2014 | Lee et al. .............. 257/738 |

* cited by examiner

PACKAGING METHODS AND PACKAGED SEMICONDUCTOR DEVICES

CROSS-REFERENCE TO RELATED CASES

This application is a continuation in part of, and claims the benefit of, U.S. patent application Ser. No. 14/265,164, filed on Apr. 29, 2014, titled "Packaging Methods and Packaged Semiconductor Devices" which application is a divisional of U.S. patent application Ser. No. 13/416,805, filed on Mar. 9, 2012 and titled "Packaging Methods and Packaged Semiconductor Devices," which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer and then singulated by sawing the integrated circuits along a scribe line. The individual dies may then be packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLP), in which dies are packaged in packages that may include a redistribution layer (RDL) that is used to fan out wiring for contact pads of the integrated circuit die so that electrical contact can be made on a larger pitch than contact pads of the die. Another type of packaging for semiconductor devices is referred to as a bump on trace (BOT) package, in which dies or "flip-chips" are attached or soldered to traces on the BOT packages.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packaging methods and structures for semiconductor devices. Novel methods of packaging semiconductor devices and structures thereof will be described herein.

Figure 1:
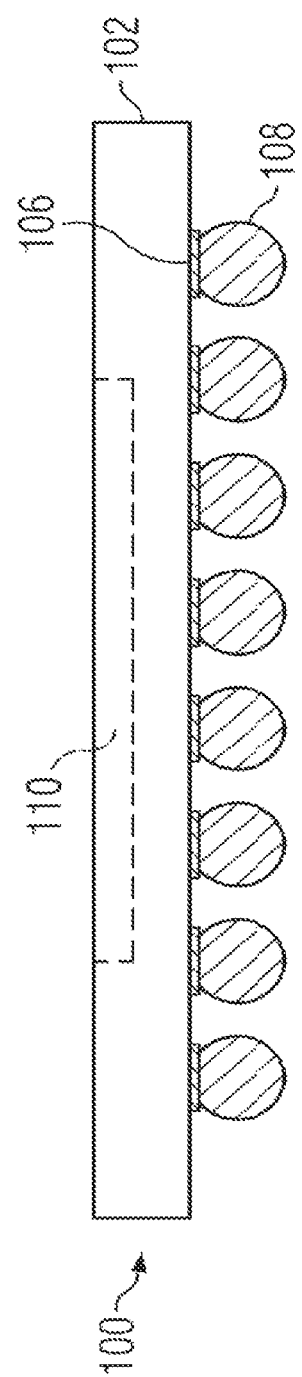
FIGS. 1 through 3 show cross-sectional views of a method of packaging semiconductor devices at various stages in accordance with an embodiment of the present disclosure.
Figure 2:
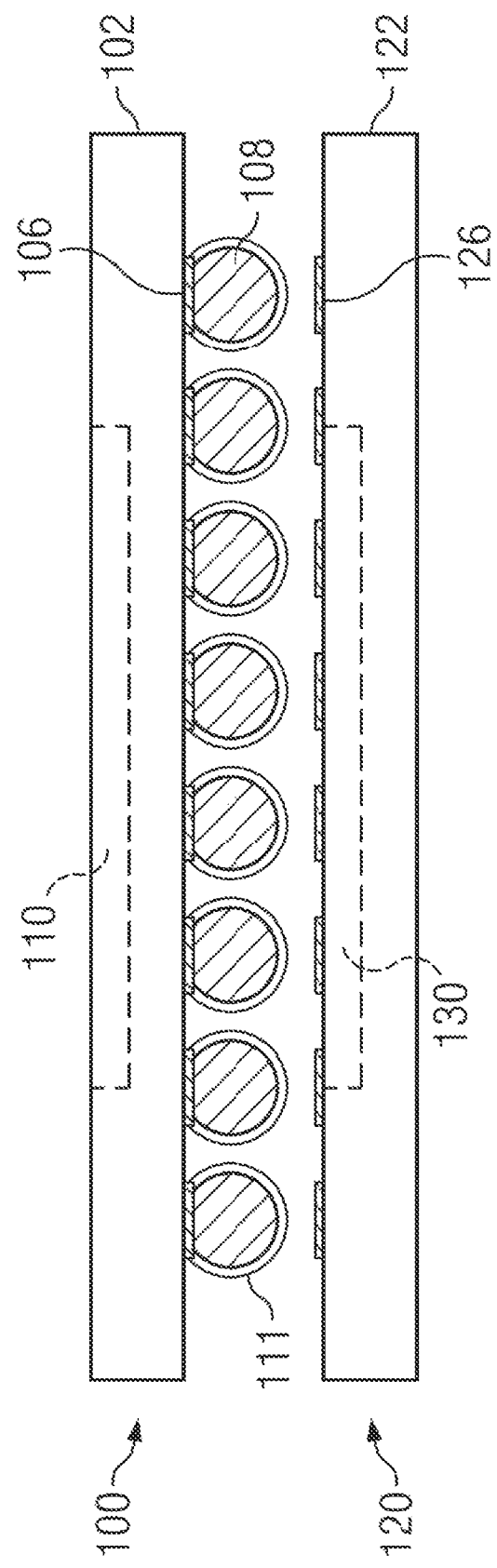
Figure 3:
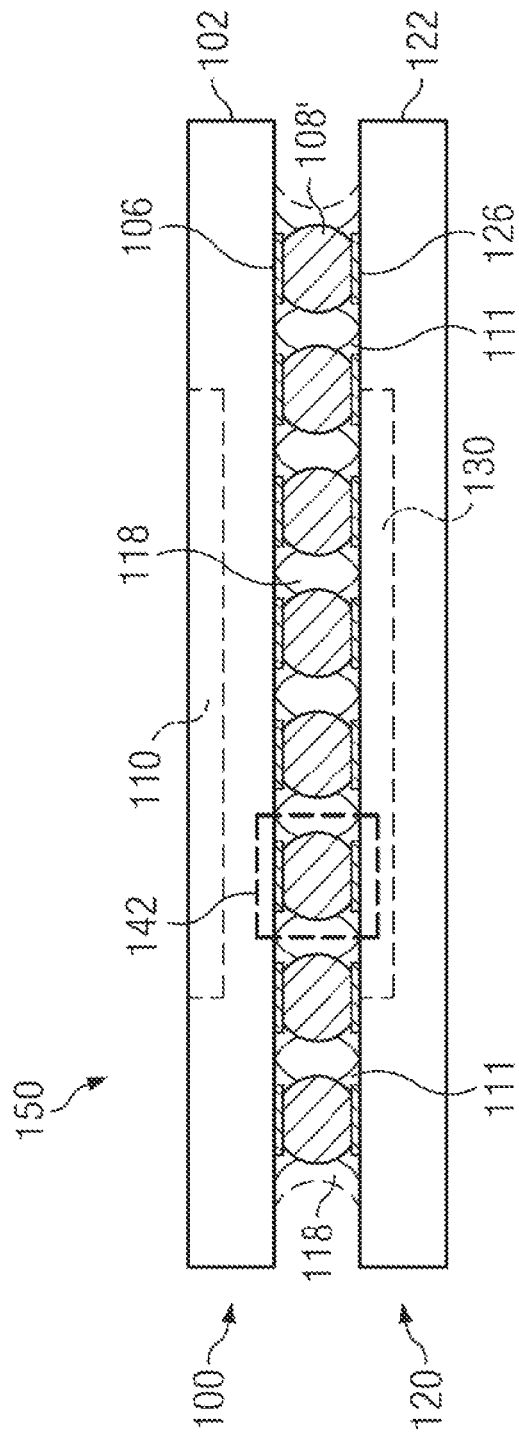

FIGS. 1 through 3 show cross-sectional views of a method of packaging semiconductor devices at various stages in accordance with an embodiment of the present disclosure. A first partially packaged die 100 is packaged with a second partially packaged die 120 in accordance with embodiments. Referring first to FIG. 1, a first die 110 (shown in phantom in FIG. 1) is provided. The first die 110 comprises an integrated circuit or chip that will be packaged with a second die (see second die 130 shown in phantom in FIG. 2) in a single package. The first die 110 and the second die 130 may each include a workpiece that may include a semiconductor substrate comprising silicon or other semiconductor materials and may be covered by an insulating layer, for example. The first die 110 and second die 130 may include one or more components and/or circuits formed in and/or over the workpiece, not shown. The first die 110 and second die 130 may include conductive layers and/or semiconductor elements, e.g., transistors, diodes, capacitors, etc., also not shown. The dies 110 and 130 may comprise logic circuitry, memory devices, or other types of circuits, as examples. The dies 110 and 130 may include a plurality of contacts formed on a surface thereof.

In some embodiments, the first die 110 comprises a memory device such as a random access memory (RAM) or other types of memory devices, and the second die 130 comprises a logic device. For example, the first die 110 may be a stacked memory dies and include low-power (LP) double data rate (DDR) memory modules, such as LPDDR1, LPDDR2, LPDDR3, or the like memory modules. The second die 130 may include a logic die, such as a central processing unit (CPU), a graphics processing unit (GPU), the like, or a combination thereof. Alternatively, the first die 110 and the second die 130 may comprise other functional circuitry.

The first die 110 is partially packaged to form a first partially packaged die 100, as shown in FIG. 1. The first partially packaged die 100 is also referred to herein as a partially packaged first die. The first die 110 may be partially packaged by attaching the first die 110 to a first substrate 102. The first substrate 102 may comprise an interposer, to be described further herein. The first substrate 102 includes a plurality of contacts 106 formed on a bottom surface thereof. The contacts 106 may comprise Cu, Al, Au, alloys thereof, other materials, or combinations and/or multiple layers thereof, as examples. The contacts 106 may alternatively comprise other materials.

In accordance with embodiments, a plurality of solder balls 108 are coupled to the contacts 106 on the bottom surface of the first substrate 102, as shown in FIG. 1. An epoxy flux 111 is disposed over the plurality of solder balls 108, as shown in FIG. 2. The epoxy flux 111 is formed on each of the plurality of solder balls 108, for example. The epoxy flux 111 includes a flux component and an epoxy component. The flux component may comprise activators, solvents, and/or additives. In some embodiments, the flux component may comprise zinc chloride, ammonium chloride, hydrochloric acid, phosphoric acid, or hydrobromic acid, as examples. The epoxy component may comprise polyepoxide, as an example. The epoxy component may comprise a similar material or the same material used for the molding compound 116 and/or 136 (see FIGS. 7 and 8, respectively) which will be described further herein, for example. The flux component may comprise a material adapted to reduce or remove oxides on the solder balls 108, to improve the solder joint 108' (see FIG. 3) formed by the solder balls 108, as an example. Alternatively, the epoxy flux 111 may comprise other materials and may include other components.

The epoxy flux 111 may be formed on the plurality of solder balls 108 by dipping the plurality of solder balls 108 in the epoxy flux 111 in some embodiments. The epoxy flux 111 may comprise a liquid that is poured into a tray, and the partially packaged first die 100 may be placed proximate the tray and lowered towards the epoxy flux 111 until the plurality of solder balls 108 are at least partially submerged in the epoxy flux 111, for example. A portion of the epoxy flux 111 adheres to the solder balls 108, e.g., due to a meniscus effect. Alternatively, the epoxy flux 111 may be sprayed onto the solder balls 108, i.e., using a jet-spray process. The epoxy flux 111 may also be formed on the plurality of solder balls 108 using other methods.

An amount of epoxy flux 111 that is formed on the solder balls 108 may be adjusted and/or controlled by altering an amount of the flux component of the epoxy flux 111 relative to the epoxy component in some embodiments. The flux component may be less viscous than the epoxy component in some embodiments, and increasing the amount of flux component may cause the epoxy flux 111 to flow faster and easier, thus forming less epoxy flux 111 on the solder balls 108, in some embodiments. Alternatively, a thickness of the epoxy flux 111 may be controlled by the jetting or the dipping amount. The thickness of the epoxy flux 111 may also be controlled using other methods. In some embodiments, the epoxy flux 111 comprises a storage modulus of about 0.1 to 10 GPa, for example.

The second die 130 is provided, and the second die 130 is also partially packaged on a second substrate 122, as described for the first die 110, forming a second partially packaged die 120, also shown in FIG. 2. The second partially packaged die 120 is also referred to herein as a partially packaged second die. The second die 130 may be partially packaged using a similar method as the first die 110 is partially packaged in some embodiments. In other embodiments, the second die 130 may be partially packaged using a different method than a method used to partially package the first die 110. In some embodiments, the first die 110 is partially packaged using a flip-chip wafer level packaging (WLP) technique and wire bonding, and the second die 130 is partially packaged using a flip-chip and bump-on-trace (BOT) technique, as an example. Alternatively, the first die 110 and the second die 130 may be partially packaged using other methods or techniques. The second partially packaged die 120 includes a plurality of contacts 126 formed on a top surface thereof.

The plurality of solder balls 108 having the epoxy flux 111 formed thereon on the first partially packaged die 100 are then coupled to the second partially packaged die 120, as shown in FIG. 3. A solder reflow process may be used to couple the plurality of solder balls 108 to the contacts 126 of the partially packaged second die 120. The solder reflow process reflows a solder material of the solder balls 108, electrically and mechanically attaching the solder balls 108 to the contacts 126 of the partially packaged second die 120.

The solder balls 108 become solder joints 108' after being attached to the contacts 126 of the partially packaged second die 120, as shown in FIG. 3. The solder joints 108' comprise the material of the solder balls 108 after the reflow process to attach the solder balls 108 to the partially packaged second die 120.

Advantageously, the flux component of the epoxy flux 111 facilitates the soldering of the solder balls 108 to the contacts 126 of the partially packaged second die 120. The flux component may be adapted to at least partially evaporate during the solder process to attach the solder balls 108 to the partially packaged second die 130. In some embodiments, the flux component of the epoxy flux 111 substantially entirely evaporates during the soldering process, so that a cleaning process to remove any flux residue is not required, for example. In other embodiments, the flux component of the epoxy flux 111 is not entirely evaporated. In these embodiments, the flux component may comprise a material that is not detrimental to subsequent packaging steps and may thus be left remaining in the packaged semiconductor device 150. In other embodiments, a cleaning process may be used to remove the flux component left remaining from the epoxy flux 111 after the solder reflow process, as another example.

In some embodiments, an optional underfill material 118, shown in phantom in FIG. 3, may be applied after the first partially packaged die 100 is coupled to the second partially packaged die 120 using the solder balls 108 with epoxy flux 111 formed thereon. The underfill material 118 may be applied using a dispensing needle along one or more edges of the packaged semiconductor device 150, for example, although other methods may also be used to form the underfill material 118. The underfill material 118 may comprise an epoxy or a polymer, although other materials may alternatively be used. However, in accordance with some embodiments, an underfill material 118 is not required, due to the use of the epoxy flux 111 having the epoxy component. Thus, the use of the epoxy flux 111 in the packaging method advantageously avoids a processing step and a material in the packaging process in some embodiments, lowering packaging costs and time.

Figure 4A:
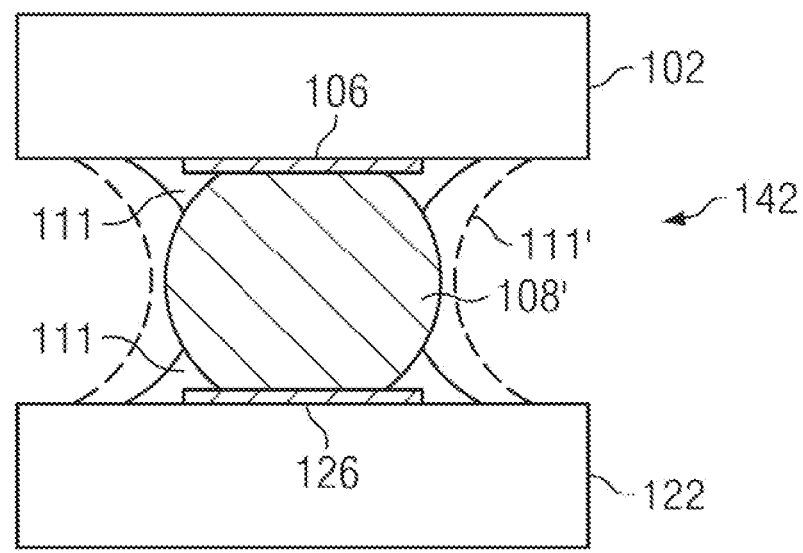
FIGS. 4A through 4C illustrate more detailed cross-sectional views of a solder joint region of FIG. 3, showing an epoxy flux disposed on the solder joints and different shapes of the solder joints in accordance with embodiments.
Figure 4B:
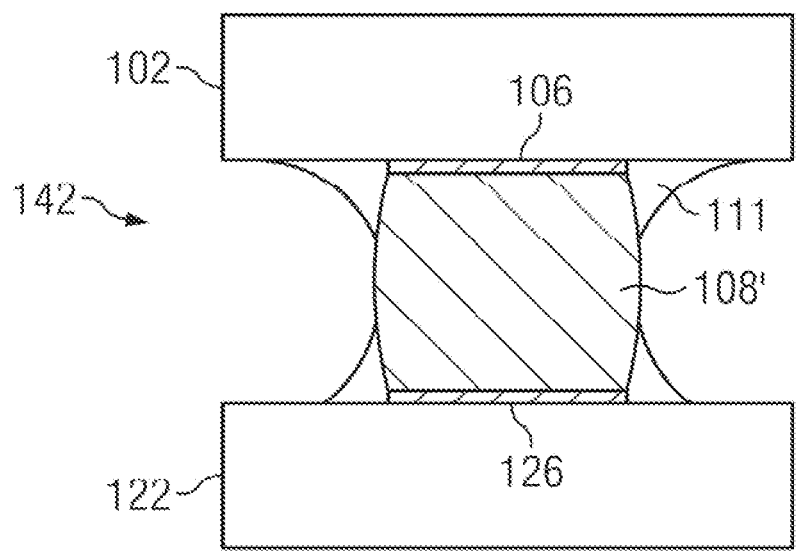
Figure 4C:
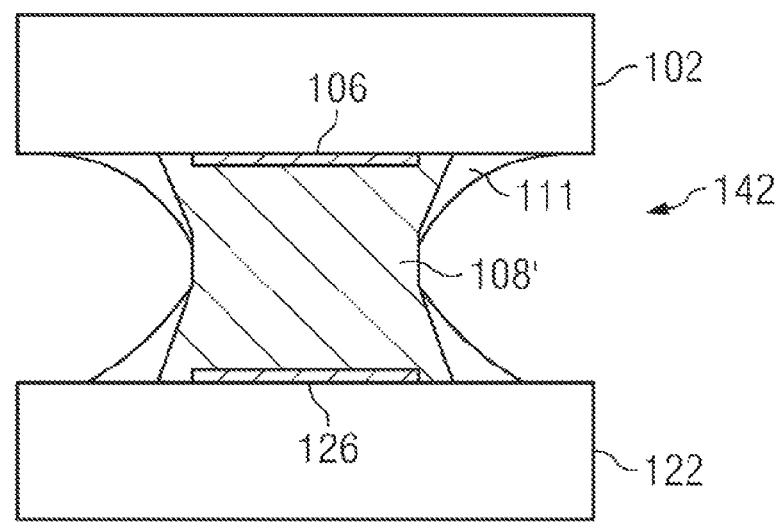

Advantageously, the use of the novel epoxy flux 111 in the packaged semiconductor device 150 results in at least a portion of the epoxy component of the epoxy flux 111 being left remaining on the solder joints 108' after the soldering process, as shown in FIGS. 4A through 4C, which illustrate more detailed cross-sectional views of a solder joint region 142 of FIG. 3. The epoxy flux 111 left remaining surrounds the solder joints 108', protecting and strengthening the solder joints 108'.

Figure 4D:
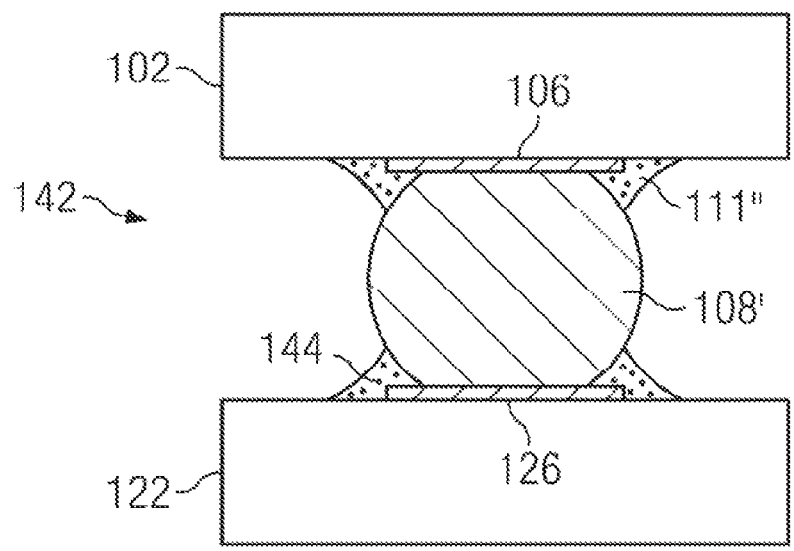
FIG. 4D is a cross-sectional view of an embodiment wherein the epoxy flux includes a filler material.
Figure 9:
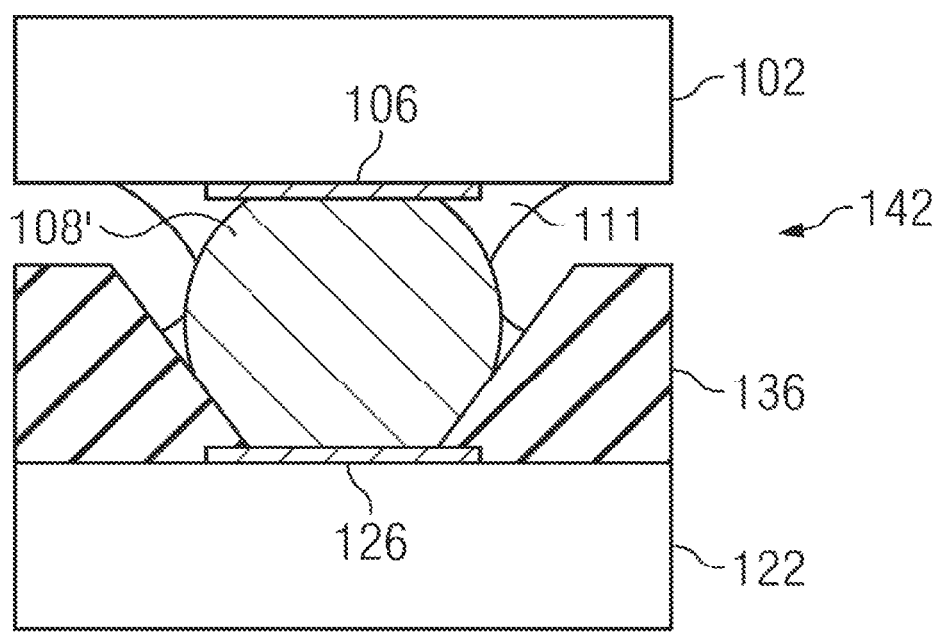
FIG. 9 illustrates a more detailed cross-sectional view of a solder joint region of FIG. 8.
Figure 11:
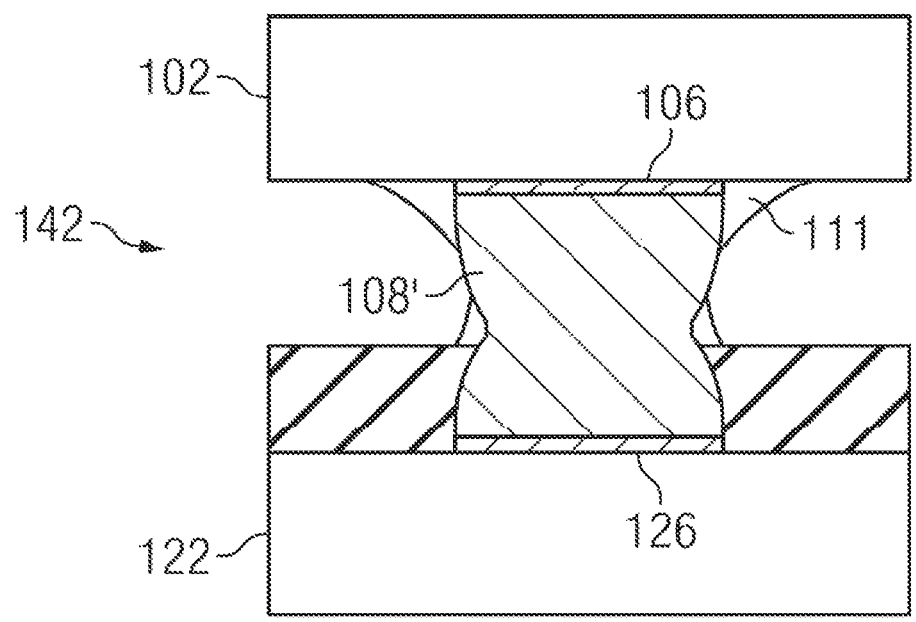
FIG. 11 illustrates a more detailed cross-sectional view of a solder joint region of FIG. 10.

Also illustrated in FIGS. 4A through 4C (and also FIGS. 4D, 6, 9, and 11) are different shapes of the solder joints 108' in accordance with embodiments after the solder reflow process. The plurality of solder joints 108' may substantially comprise a shape of a circle or oval in a cross-sectional view, as shown in FIGS. 4A, 4D, and 9. Alternatively, the plurality of solder joints 108' may substantially comprise a shape of a barrel in a cross-sectional view, as shown in FIG. 4B. In other embodiments, the plurality of solder joints 108' may substantially comprise a shape of an hour glass in a cross-sectional view, as shown in FIG. 4C, or a shape of a portion of a figure eight, as shown in FIG. 11.

In FIG. 4A, a portion of the epoxy flux 111 is left remaining after the soldering process proximate the solder joints 108', in accordance with embodiments. The epoxy flux 111 may comprise a greater thickness adjacent the plurality of solder joints 108' proximate the first substrate 102 and the second substrate 122 than proximate a wider central region of the plurality of solder joints 108', in some embodiments. The epoxy flux 111 may not reside at all on the central region of the plurality of solder joints 108' in some embodiments, as shown in FIG. 4A.

Alternatively, a small amount of epoxy flux 111 may reside on the central region of the plurality of solder joints 108' in some embodiments, as shown in phantom at 111' in FIG. 4A. The small amount of epoxy flux 111' may also reside on the central region of the plurality of solder joints 108' in the other embodiments described herein, not shown in the drawings. The epoxy flux 111 or 111' left remaining on the solder joints 108' may comprise only the epoxy component in some embodiments, or both the epoxy component and a portion of the flux component, in other embodiments.

The solder joints 108' join together the contacts 106 on the first substrate 102 and the contacts 126 on the second substrate 122. The epoxy flux 111 or 111' left remaining on the solder joints 108' advantageously strengthens the solder joints 108' and reduces or prevents cracking due to thermal and/or mechanical stress, e.g., during the packaging process, during thermal cycling tests or other tests of the packaged semiconductor device 150 (see FIG. 3), during shipping of the packaged semiconductor device 150, and/or when the packaged semiconductor device 150 is used in an end application. Thus, the epoxy flux 111 or 111' improves the electrical and mechanical connection provided by the solder joints 108' that join the first substrate 102 to the second substrate 122.

FIG. 4D is a cross-sectional view of an embodiment wherein the epoxy flux 111" includes a filler material 144. The filler material 144 may comprise an insulating material or conductive material, for example. In some embodiments the filler material 144 may comprise $SiO_2$ or aluminum nitride, as examples, although alternatively, the filler material 144 may comprise other types of materials. The filler material 144 may comprise about 20 to 90% by volume or weight of the epoxy flux 111, as an example. Alternatively, other amounts of the filler material 144 may be used. The filler material 144 is adapted to increase a thermal conductivity of the epoxy flux 111" in some embodiments, for example. The filler material 144 may alternatively have other functions.

Figure 5:
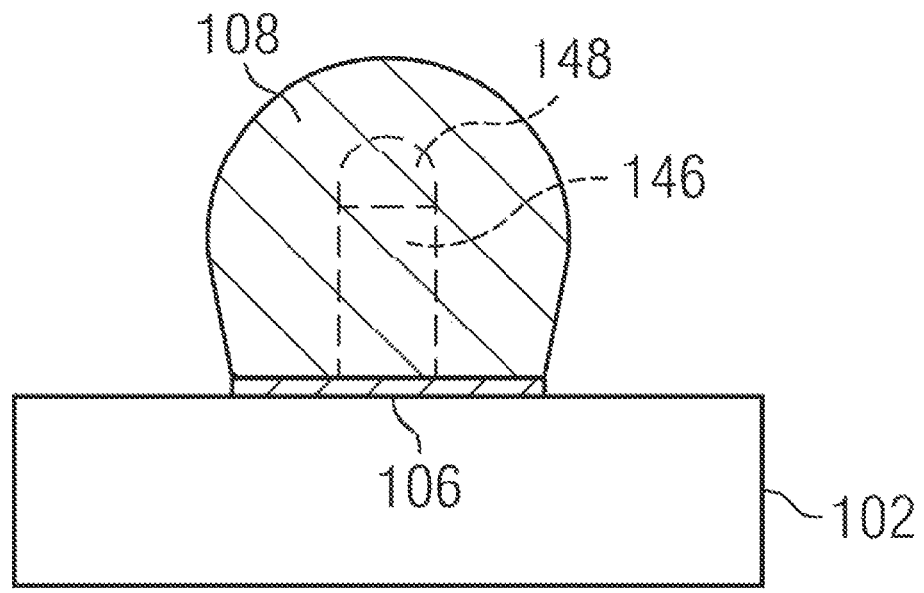
FIGS. 5 and 6 show cross-sectional views of embodiments wherein solder balls that form the solder joints include a metal stud.
Figure 6:
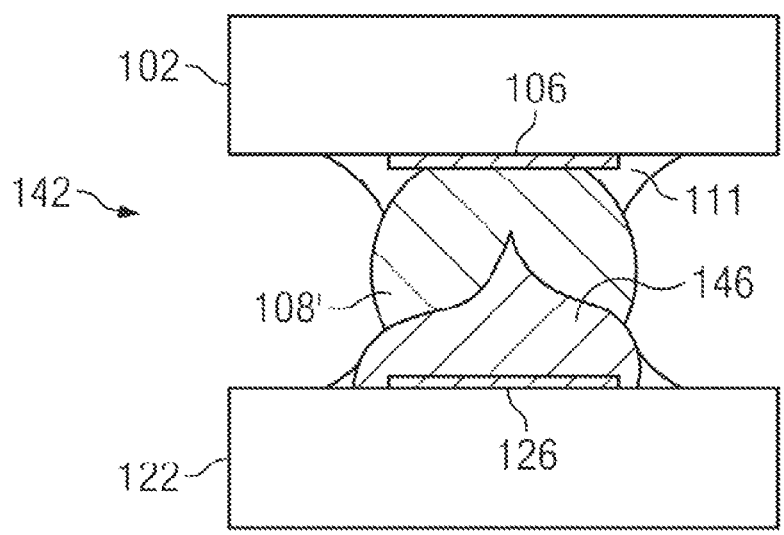

FIGS. 5 and 6 show cross-sectional views of embodiments wherein the solder balls 108 include a metal stud 146. The contacts 106 on the first substrate 102 may include a metal stud 146 formed thereon, as shown in phantom in FIG. 5. The metal stud 146 may also comprise a metal pillar, for example. The metal stud 146 may comprise Au, Cu, or other metals, for example. The solder balls 108 are formed on the metal studs 146 in this embodiment, as shown. An optional silicide 148 comprising $NiSi_x$ or other materials may be formed over the metal studs 146 in some embodiments, for example. FIG. 6 shows a cross-sectional view of a solder joint region 142 formed by the solder ball 108 in FIG. 5 after a solder reflow process in accordance with an embodiment. A portion of the metal stud 146 may be viewable in a cross-sectional view of the solder joint 108' after the solder reflow process, in some embodiments, as shown.

Figure 7:
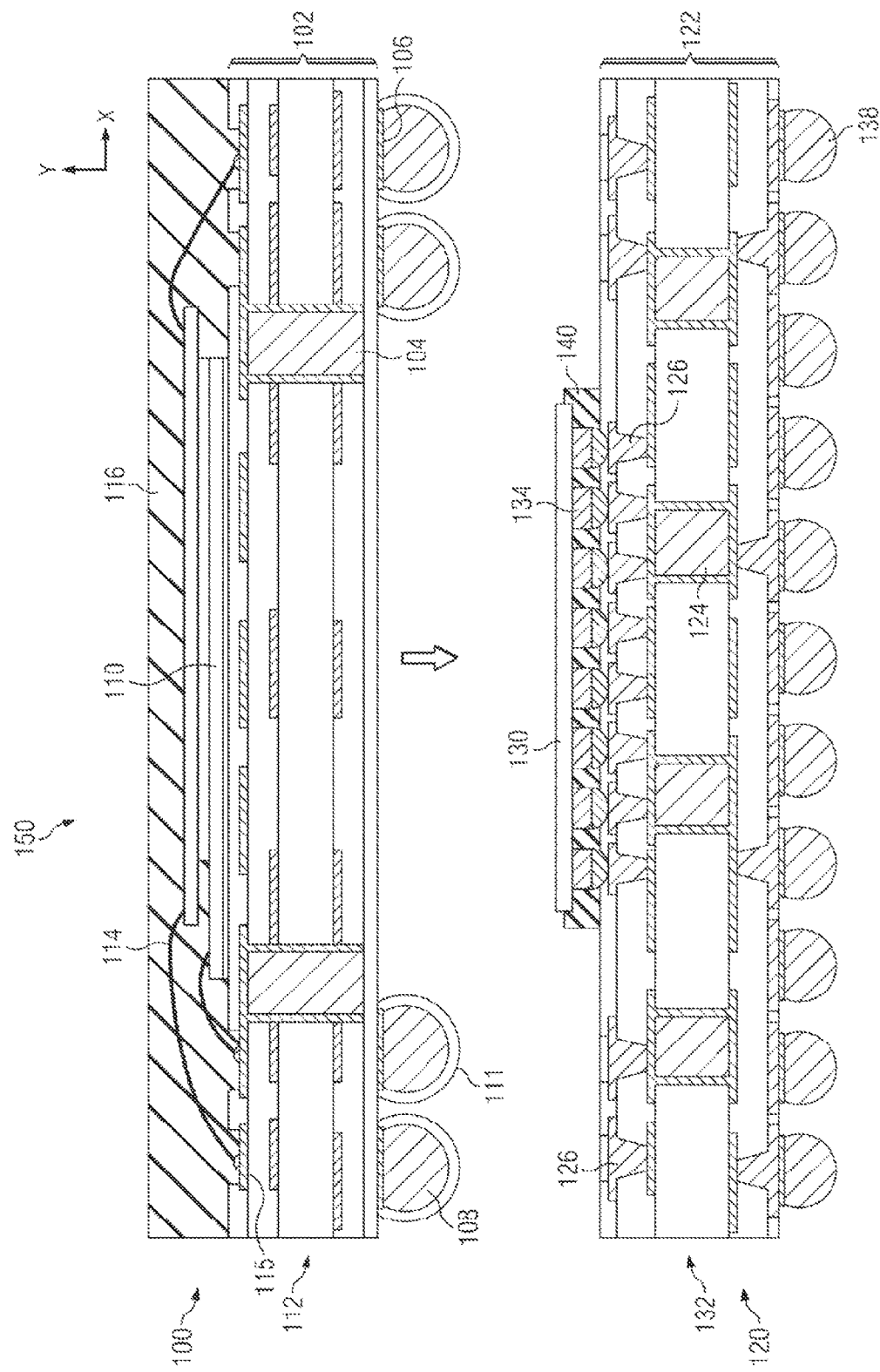
FIGS. 7 and 8 show cross-sectional views of methods of packaging semiconductor devices in accordance with embodiments.

FIG. 7 shows a cross-sectional view of a method of packaging semiconductor devices in accordance with an embodiment. More detailed views of the substrates 102 and 122 are shown. Note that in the embodiments shown in FIGS. 7, 8, 10, and 12, the packaged semiconductor devices 150 are shown before the first partially packaged die 100 is coupled to the second partially packaged die 120 using the solder balls 108 having the epoxy flux 111 disposed thereon. The final packaged semiconductor devices 150 actually comprise the first partially packaged die 100 coupled to the second partially packaged die 120 using the solder joints 108' having the epoxy flux 111 disposed thereon, as shown in FIG. 3.

Referring again to FIG. 7, the first substrate 102 and/or the second substrate 122 may comprise interposers in some embodiments. The first substrate 102 and/or the second substrate 122 may include a plurality of through-substrate vias (TSVs) 104 and 124, respectively, and may comprise TSV interposers in some embodiments. The TSVs 104 and 124 comprise conductive or semiconductive material that extends completely through the substrates 102 and/or 122. The TSVs 104 and 124 may optionally be lined with an insulating material. The TSVs 104 and 124 provide vertical electrical connections (e.g., y-axis connections) from a bottom surface to a top surface of the substrates 102 and 122, respectively. The first substrate 102 and/or the second substrate 122 may include electronic components and elements formed thereon in some embodiments, or alternatively, the first substrate 102 and/or the second substrate 122 may be free of electronic components and elements.

The substrates 102 and/or 122 may each include wiring 112 and 132, respectively. The wiring 112 and/or 132 provides horizontal electrical connections (e.g., x-axis connections) in some embodiments, for example. The wiring 112 and 132 may include fan-out regions that include traces of conductive material for expanding the footprint of the first die 110 and second die 130 to a footprint of a bottom side of the substrates 102 and/or 122, respectively, e.g., of contacts 106 of the first substrate 102 (and contacts within wiring 132 of the second substrate 122, not labeled) that are coupled to the solder balls 108 and solder balls 138, respectively.

The wiring 112 and/or 132 of the substrates 102 and 122 may include one or more redistribution layers (RDLs). The RDLs may comprise one or more insulating layers and wiring layers. The RDLs may include inter-level dielectrics (ILDs) with wiring in metallization layers disposed or formed therein. The insulating layers can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used. The insulating layers may be deposited by chemical vapor deposition (CVD), atomic layer deposition (ALD), physical vapor deposition (PVD), a spin-on-dielectric process, the like, or a combination thereof.

The wiring layers may be a conductive material, such as copper, aluminum, titanium, the like, or a combination thereof, with or without a barrier layer. The wiring 112 and 132 may comprise one or more vias and/or conductive lines, for example. The wiring 112 and 132, and also the TSVs 104 and 124, may be formed using one or more subtractive etch processes, single damascene techniques, and/or dual damascene techniques, as examples. One or more carrier wafers, not shown, may be used to form the wiring 112 and 132 and/or the TSVs 104 and 124. A portion of the wiring 112 and 132 resides on the top and bottom surfaces of the substrates 102 and 122, respectively; e.g., portions of the wiring 112 of the first substrate 102 may comprise contacts 106, wire bond pads 115 and/or other traces, and portions of the wiring 132 of the second substrate 122 may comprise contacts 126 and other contacts (not labeled) or traces that are coupleable to other elements, such as the solder balls 138 formed on the bottom surface of the second substrate 122.

In some embodiments, the first substrate 102 may not include an RDL in the wiring 112, as shown in FIG. 7. All or some of the x-axis or horizontal electrical connections may be made using the wire bonds 114 that couple contacts on the first die 110 to wire bond pads 115 on the first substrate 102, in this embodiment. In some embodiments, the second substrate 122 may include two RDLs in the wiring 132, also shown in FIG. 7. One RDL may be disposed proximate the top surface of the second substrate 122 and may be adapted to make x-axis electrical connections between contacts 126 coupled to connectors 134 and contacts 126 that will be coupled to the solder balls 108. The connectors 134 may be microbumps and may be referred to as microbumps 134 hereinafter. The other RDL may be disposed proximate the bottom surface of the second substrate 122 and may be adapted to make x-axis electrical connections between the TSVs 124 and the contacts coupled to the plurality of solder balls 138 disposed on the bottom surface of the second substrate 122, for example.

A method of attaching the dies 110 and 130 to the substrates 102 and 122, respectively, is also illustrated in FIG. 7. In the embodiment shown, the first die 110 is coupled to the first substrate 102 using a flip-chip technique, wherein wire bonds 114 are attached to contacts on the first die 110 at one end and wherein the wire bonds 114 are attached to contacts or wire bond pads 115 on the top surface of the first substrate 102 at the other end. The dies 110 and the wire bonds 114 may be encapsulated in the molding compound 116. In some embodiments, the molding compound 116 is a polymer, an epoxy, silicon oxide filler material, the like, or a combination thereof.

The second die 130 is attached to the second substrate 122 using a flip-chip bond-on-trace (BOT) attachment technique, wherein microbumps 134 are coupled to the second die 130, and the microbumps 134 are then soldered to contacts 126 in a central region of the top surface of the second substrate 122, for example. An optional underfill material 140 may be formed under the second die 130, over the second substrate 122, as shown. The underfill material 140 may comprise similar materials and may be applied using similar methods as described for the optional underfill material 118 shown in FIG. 3, for example. Alternatively, other methods may be used to attach the first die 110 and/or the second die 130 to the first substrate 102 and/or the second substrate 122, respectively. The same method or a different method may be used to attach the first die 110 to the first substrate 102, than is used to attach the second die 130 to the second substrate 122.

Figure 8:
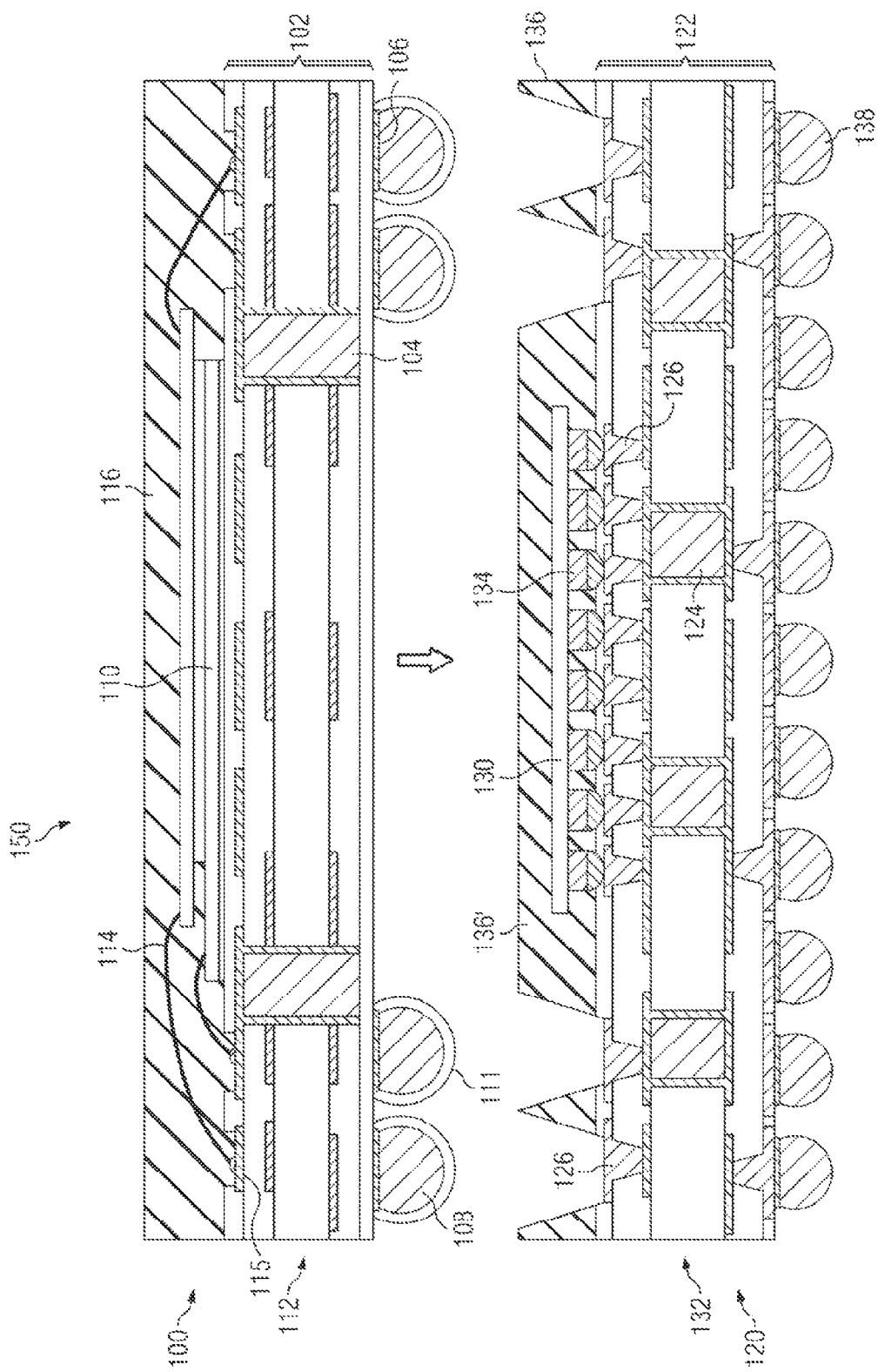

FIG. 8 illustrates a cross-sectional view of a method of packaging semiconductor devices in accordance with another embodiment. Like numerals are used to describe the various elements and components as were used in the previous figures. In this embodiment, a molding compound 136 is applied over the second partially packaged die 120 after the second die 130 is attached to the second substrate 122 and after the optional underfill material 140 is applied. The molding compound 136 may comprise similar materials as described for molding compound 116 of the first partially packaged die 100 shown in FIG. 7, for example.

A portion of the molding compound 136 is removed from over the top surface of the second substrate 122 over contacts 126, leaving the contacts 126 exposed. The top surface of the second substrate 122 may comprise a plurality of contacts 126 disposed thereon around a perimeter of the second substrate 122, as shown in FIG. 8. The second die 130 is attached to contacts 126 in a central region of the second substrate 122. Contacts 126 in a perimeter region of the second substrate 122 may be larger than contacts 126 in a central region of the second substrate 122, as shown. Portions of the molding compound 136 are removed from over the plurality of contacts 126 on the top surface of the second substrate 122 using lithography or a laser, as examples, or other methods may alternatively be used. The portions of the molding compound 136 removed may comprise through-molding vias (TMVs), for example. The plurality of solder balls 108 are attached to the top surface of the second substrate 122 through the TMVs formed in the molding compound 136. FIG. 9 illustrates a more detailed cross-sectional view of a solder joint region 142 of the embodiment shown in FIG. 8. The solder joints 108' may comprise a substantially circular shape in this embodiment.

Figure 10:
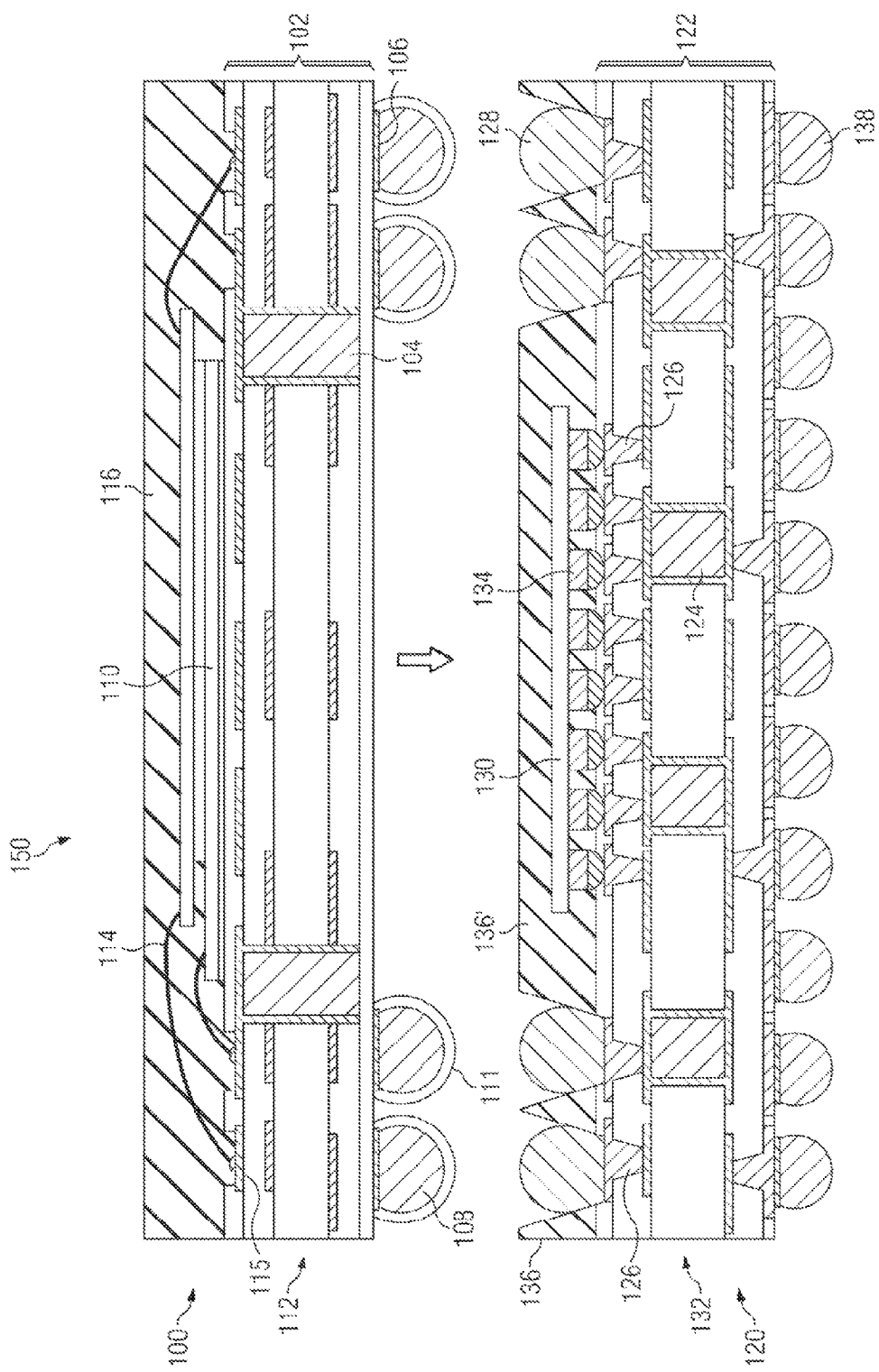
FIG. 10 shows a cross-sectional view of a method of packaging semiconductor devices in accordance with another embodiment.

FIG. 10 shows a cross-sectional view of a method of packaging semiconductor devices in accordance with another embodiment. After the molding compound 136 described in FIG. 8 is formed and patterned to expose the contacts 126 in the perimeter region of the second substrate 122, a plurality of solder balls 128 is formed on the plurality of contacts 126 exposed within the molding compound 136 on the second substrate 122, in this embodiment. The plurality of solder balls 128 on the second substrate 122 is then coupled to the plurality of solder balls 108 with epoxy flux 111 disposed thereon on the first substrate 102, and the solder of the solder balls 108 and 128 is reflowed. FIG. 11 illustrates a more detailed cross-sectional view of a solder joint region 142 of the embodiment shown in FIG. 10. The solder joints 108' after the reflow process comprise a portion of a figure eight shape in a cross-sectional view. The solder joints 108' comprise a bottom portion that includes the material of the solder balls 128 on the second substrate 122 and a top portion that includes the material of the solder balls 108 on the first substrate 102, after the solder reflow process.

Figure 12:
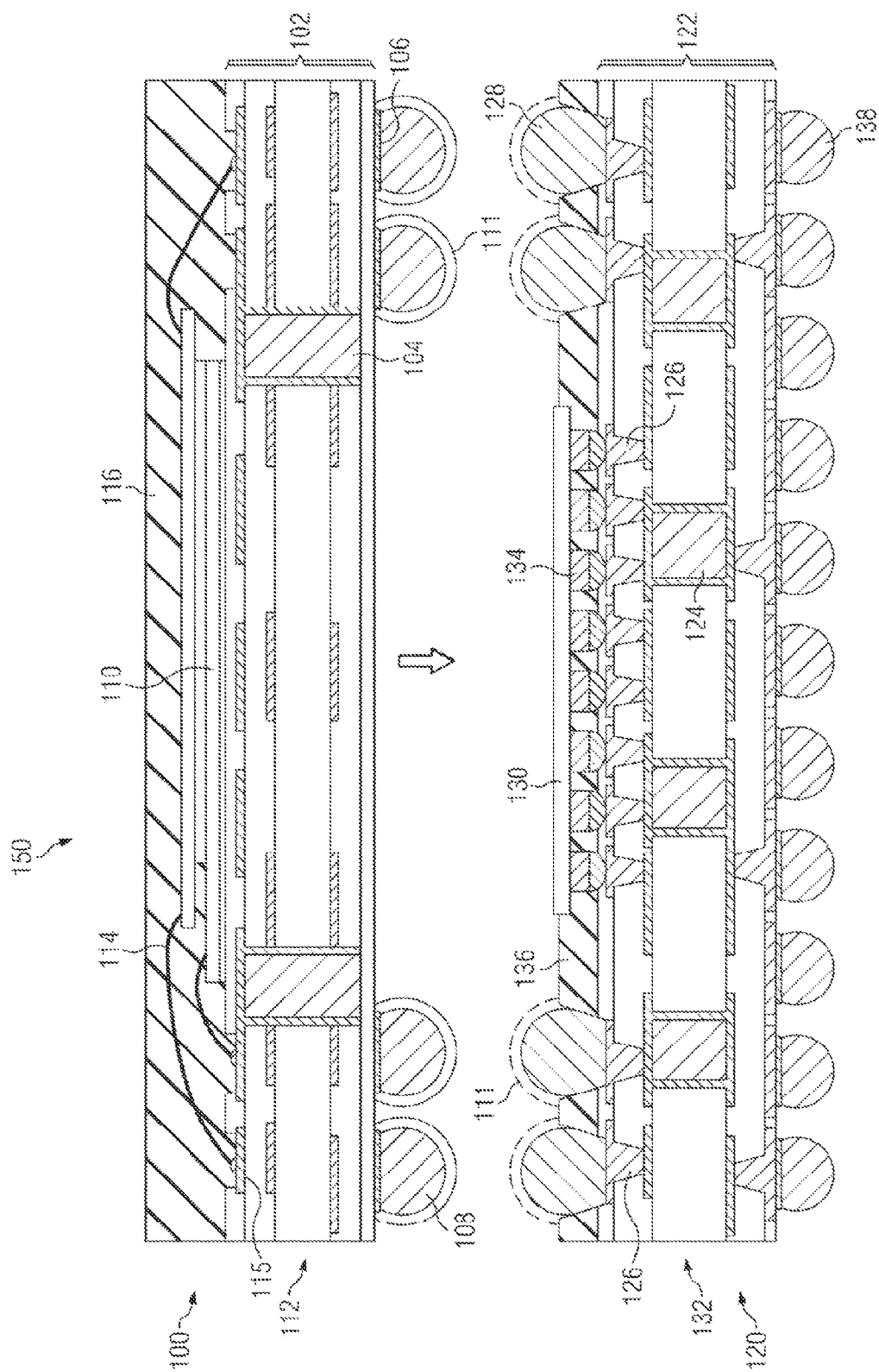
FIG. 12 shows a cross-sectional view of a method of packaging semiconductor devices in accordance with another embodiment.

In the embodiments shown in FIGS. 8 through 11, the molding compound 136 extends over a top surface of the second die 130, as shown at 136' in FIG. 8 and FIG. 10. In other embodiments, the molding compound 136 may be formed to a lower height over the second substrate 122 so that the second die 130 is not covered by the molding compound 136, as shown in FIG. 12. Alternatively, the molding compound 136 may be applied to cover the second die 130 initially, and the portion of the molding compound 136' (see FIG. 8 and FIG. 10) residing over the top surface of the second die 130 is then removed, e.g., using an etch-back process. In some embodiments such as the one shown in FIG. 12, solder balls 128 may be formed on the top surface of the second substrate 122 over the contacts 126, before the molding compound 136 is applied. The etch-back process used to remove the excess molding compound 136' may result in exposing a top portion of the solder balls 128 so that they may be attached to the solder balls 108 on the first substrate 102, for example.

In accordance with the embodiments shown in FIGS. 10 and 12 having solder balls 128 on the second partially packaged die 120, the epoxy flux 111 may be applied to solder balls 108 on the first partially packaged die 100. Alternatively, the epoxy flux 111 may not be applied to solder balls 108, but rather, the epoxy flux 111 may be applied to solder balls 128 disposed on the top surface of the second partially packaged die 120, as shown in phantom in FIG. 12. The epoxy flux 111 can be applied to either solder balls 108 or solder balls 128, for example. In other embodiments, the epoxy flux 111 may be applied to both the solder balls 108 on the first partially packaged die 100 and to the solder balls 128 on the second partially packaged die 120, for example.

Figure 13:
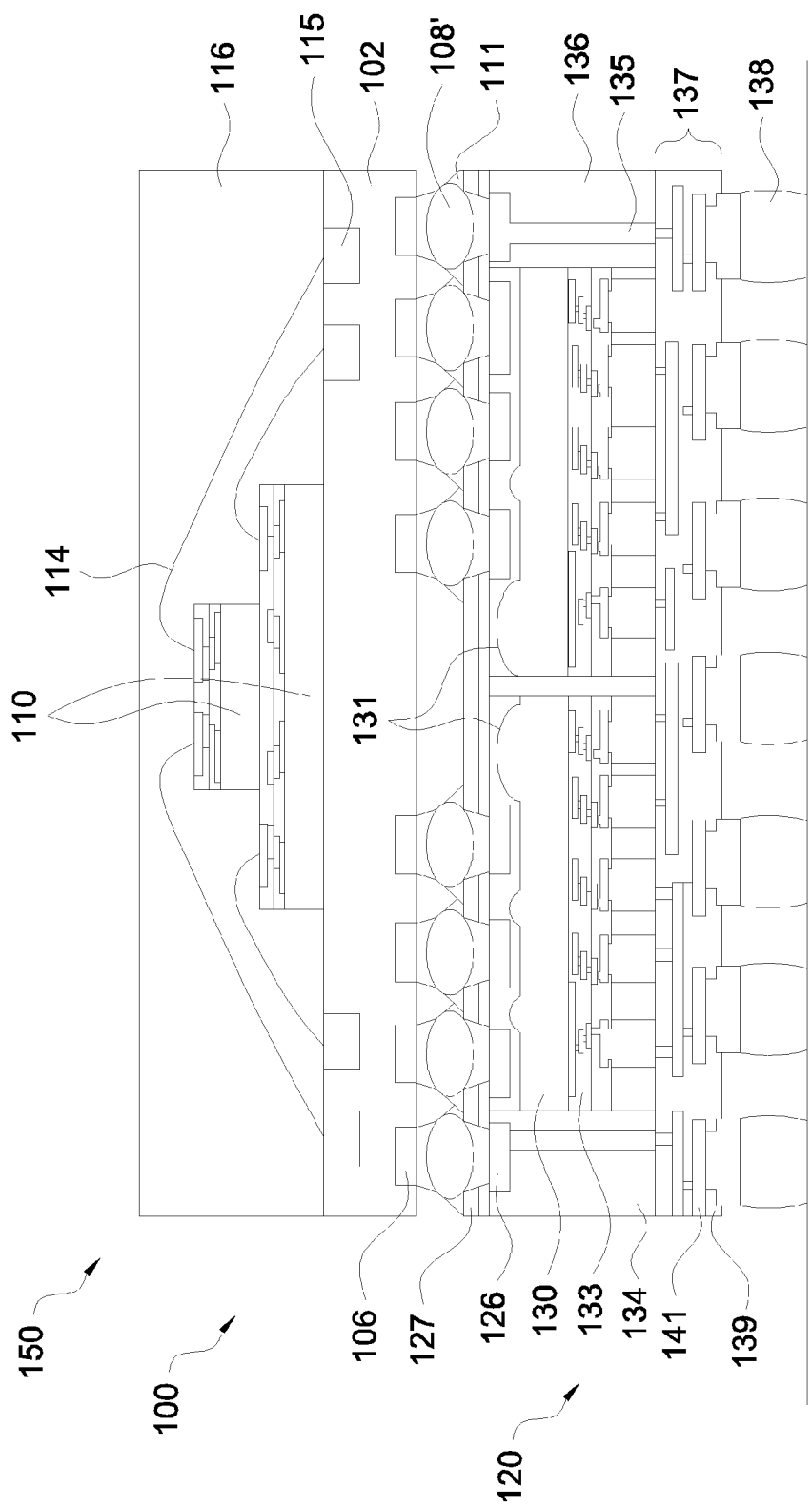
FIG. 13 shows a cross-sectional view of a semiconductor package in accordance with another embodiment.

FIG. 13 illustrates a packaged semiconductor device 150 including an integrated fan-out (InFO) package configuration for the partially packaged die 120. In some embodiments, the partially packaged die 120 does not include a substrate (see substrate 122 in FIG. 7).

The InFO package 120 may be formed in an orientation opposite of that shown in FIG. 13 (e.g. the package 120 can be formed and flipped over). In some embodiments, the InFO package 120 may be formed by first forming one or more passivation layers 127 over a carrier wafer (not shown) and forming contacts 126 over the passivation layer 127. The dies 130 may then be attached over the contacts 126 and the passivation layer 127. In other embodiments, the passivation layer 127 is not formed until after partially packaged die 120 is formed and removed from the carrier wafer (not shown) and the passivation layer 127 is formed over the dies 130 and the molding compound 136. In some other embodiments, the passivation layer 127 is omitted.

Backside surfaces of the dies 130 may be attached over the contacts 126 and the carrier wafer (not shown) using an adhesive layer 131, such as a die attach film or the like. The dies 120 may be a single die or may be more than two dies. The dies 130 may include a logic die, such as a CPU, a GPU, the like, or a combination thereof. In some embodiments, the dies 130 include a die stack (not shown) which may include both logic dies and memory dies. The dies 130 may include an input/output (I/O) die, such as a wide I/O die that provides a connection between partially packaged dies 120 and 100.

The active surfaces of the dies 130 include interconnect structures 133 and connectors 134. The interconnect structures 133 may include one or more RDLs. The RDLs may comprise one or more insulating layers and wiring layers. The RDLs may include ILDs with wiring in metallization layers disposed or formed therein. The insulating layers can be silicon nitride, silicon carbide, silicon oxide, low-k dielectrics such as carbon doped oxides, extremely low-k dielectrics such as porous carbon doped silicon dioxide, a polymer, such as an epoxy, polyimide, BCB, PBO, the like, or a combination thereof, although other relatively soft, often organic, dielectric materials can also be used. The insulating layers may be deposited by CVD, PVD, ALD, a spin-on-dielectric process, the like, or a combination thereof.

The wiring layers may be a conductive material, such as copper, aluminum, titanium, the like, or a combination thereof, with or without a barrier layer. The interconnect structures 133 may comprise one or more vias and/or conductive lines, for example. The interconnect structures 133 may be formed using one or more subtractive etch processes, single damascene techniques, and/or dual damascene techniques, as examples.

The connectors 134 were described as microbumps 134 in previous embodiments. In this embodiment, the connectors 134 may be contacts, bond pads, underbump metallizations (UBMs), the like, or a combination thereof. In some embodiments, the connectors 134 are formed by forming recesses into a dielectric layer on the interconnect structures 133. The recesses may be formed to allow the connectors 134 to be embedded into the dielectric layer. In other embodiments, the recesses are omitted as the connectors 134 may be formed on the dielectric layer. The connectors 134 electrically and/or physically couple the dies 130 to the partially packaged die 100 through the electrical connectors 135, and/or other packages through the solder balls 138. In some embodiments, the connectors 134 include a thin seed layer (not shown) made of copper, titanium, nickel, gold, the like, or a combination thereof. The conductive material of the connectors 134 may be deposited over the thin seed layer. The conductive material may be formed by an electro-chemical plating process, CVD, ALD, PVD, the like, or a combination thereof. In an embodiment, the conductive material of the connectors 134 is copper, tungsten, aluminum, silver, gold, the like, or a combination thereof.

In an embodiment, the connectors 134 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 134. Any suitable materials or layers of material that may be used for the UBMs 134 are fully intended to be included within the scope of the current application.

In other embodiments, the connectors 134 are vias extending from the second side of the dies 130 partially into the dies 130 or, in some embodiments, completely through the dies 130. The vias 134 may be formed by an etch process to form holes (not shown) in the dies 130 and the holes may be filled by a conductive material such as copper, aluminum, nickel, gold, silver, palladium, the like, or a combination thereof, and may have a composite structure including a plurality of layers. The vias 134 may also include seed layers, barrier layers, liners, the like, or a combination thereof.

Electrical connectors 135 may be formed over some of the contacts 126 before or after the dies 130 are attached. The electrical connectors 135 may include a seed layer (not shown) and may extend in a direction that is substantially perpendicular to a surface of the contact 126. In some embodiments, the electrical connectors 135 are formed through electrical plating. In these embodiments, the electrical connectors 135 are made of copper, aluminum, nickel, gold, silver, palladium, the like, or a combination thereof, and may have a composite structure including a plurality of layers. In these embodiments, a sacrificial layer (not shown), such as a photoresist, is formed over the carrier wafer. In some embodiments, the photoresist is formed and patterned over the contacts 126 and then the electrical connectors 135 are formed in the patterned photoresist. The photoresist may be formed by a wet process, such as a spin-on process, or by a dry process, such as by applying a dry film. A plurality of openings may be formed in the photoresist to expose the underlying contacts 126, and then a plating step may be performed to plate the electrical connectors 135.

In alternative embodiments, the electrical connectors 135 may be stud bumps, which are formed by wire bonding on the contacts 126, and cutting the bond wire with a portion of bond wire left attached to the respective bond ball. For example, the electrical connectors 135 may include a lower portion and an upper portion, wherein the lower portion may be a bond ball (not shown) formed in the wire bonding, and the upper portion may be the remaining bond wire (not shown). The upper portion of the electrical connector 135 may have a uniform width and a uniform shape that are uniform throughout the top part, the middle part, and the bottom part of upper portion. The electrical connectors 135 may be formed of non-solder metallic materials that can be bonded by a wire bonder. In some embodiments, the electrical connectors 135 are made of copper wire, gold wire, the like, or a combination thereof, and may have a composite structure including a plurality of layers. In the wire bonding embodiments, the seed layer and the sacrificial layer may be omitted.

The electrical connectors 135 may form a backside redistribution layer for the partially packaged die 120. This backside redistribution layer may be used to couple another package(s) or component(s) to the partially packaged die 120.

After the dies 130 are attached and formed and the electrical connectors 135 are formed, the dies 130 and the electrical connectors 135 may be encapsulated. In some embodiments, the dies 130 and the electrical connectors 135 are encapsulated by the molding compound 136. The molding compound 136 may be molded on the dies 130 and the electrical connectors 135, for example, using compression molding. A curing step may be performed to cure the molding compound 136, wherein the curing may be a thermal curing, an ultraviolet curing, the like, or a combination thereof.

In some embodiments, the dies 130, the connectors 134, and the electrical connectors 135 are buried in the molding compound 136, and after the curing of the molding compound 136, a planarization step, such as a grinding, is performed on the molding compound 136. The planarization step may be used to remove excess portions of the molding compound 136, which excess portions are over top surfaces of the connectors 134 and the electrical connectors 135. In some embodiments, surfaces of the connectors 134 and surfaces of the electrical connectors 135 are exposed, and are level with a surface of the molding compound 136. The electrical connectors 135 may be referred to as TMVs, through package vias (TPVs), and/or through InFO vias (TIVs) and will be referred to as TIVs 135 hereinafter. The TIVs 135 may have a first surface substantially coplanar with the backside surfaces of the dies 130 and a second surface substantially coplanar with the active surfaces of the dies 130.

After encapsulation, an interconnect structure 137 and the solder balls 138 may be formed over the dies 130, the connectors 134, the molding compound 136, and the TIVs 135. The interconnect structure 137 may include one or more RDLs. The RDLs may comprise one or more insulating layers 139 and wiring layers 141. The RDLs may include ILDs with wiring in metallization layers disposed or formed therein. The insulating layers 139 can be silicon nitride, silicon carbide, silicon oxide, low-k dielectrics such as carbon doped oxides, extremely low-k dielectrics such as porous carbon doped silicon dioxide, a polymer, such as an epoxy, polyimide, BCB, PBO, the like, or a combination thereof, although other relatively soft, often organic, dielectric materials can also be used. The insulating layers may be deposited by CVD, PVD, ALD, a spin-on-dielectric process, the like, or a combination thereof. The wiring layers 141 may be a conductive material, such as copper, aluminum, titanium, the like, or a combination thereof, with or without a barrier layer. The interconnect structure 137 may include one or more vias and/or conductive lines, for example. The interconnect structure 137 may be formed using one or more subtractive etch processes, single damascene techniques, and/or dual damascene techniques, as examples.

The interconnect structure 137 may be referred to as a frontside redistribution layer for the partially packaged die 120. This frontside redistribution layer 137 may be utilized to couple the partially packaged dies 120 and/or 100 via the connectors 135 and 138 to one or more packages, package substrates, components, the like, or a combination thereof.

The number of wiring layers 141 and the number of insulating layers 139 are only for illustrative purposes and are not limiting. There may be other number of passivation layers, and other number of metal layers different from those illustrated in FIG. 13.

Although the connectors 108 and 138 have been described as solder balls, they may be any suitable conductive connector. For example, the conductive connectors 108 and 136 may be solder balls, metal pillars, controlled collapse chip connection (C4) bumps, micro bumps, electroless nickel-electroless palladium-immersion gold technique (ENEPIG) formed bumps, or the like. The conductive connectors 108 and 136 may include a conductive material such as solder, copper, aluminum, gold, nickel, silver, palladium, tin, the like, or a combination thereof. In an embodiment in which the conductive connectors 108 and/or 136 are solder bumps, they are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 108 and/or 136 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors. The metal cap layer may include nickel, tin, tin-lead, gold, silver, palladium, indium, nickel-palladium-gold, nickel-gold, the like, or a combination thereof and may be formed by a plating process.

Similar to the processes described above in FIGS. 7, 8, 10, and 12, the partially packaged die 100 may be attached to the partially packaged die 120 with the solder joints 108'. The solder joints 108' may be formed by a reflow process on solder balls 108. In addition, the solder joints 108' include the epoxy flux 111 surrounding portions of the solder joints 108'. The epoxy flux 111 may be formed by dipping, jetting, or the like on the solder balls 108. As discussed below in FIGS. 14A through 15D, the epoxy flux 111 may also be formed from epoxy solder paste.

Figure 14A:
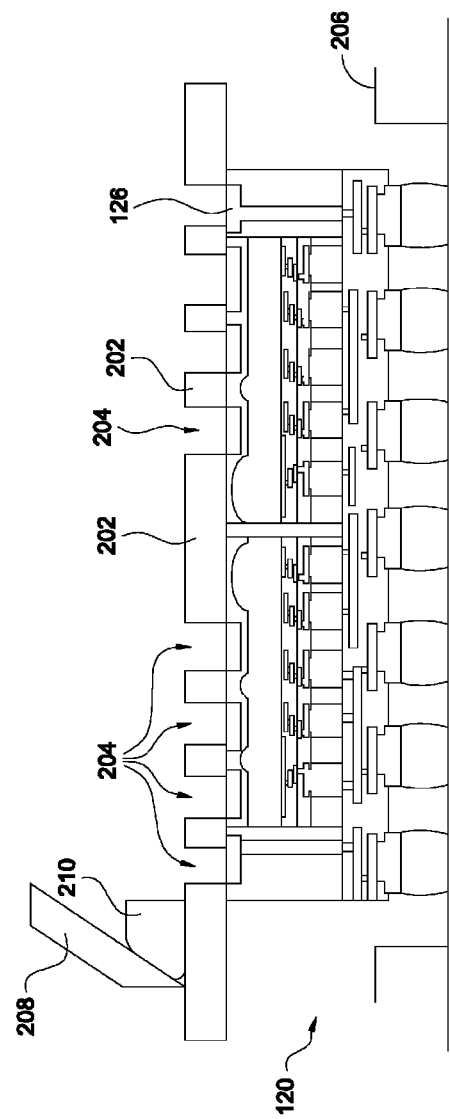
FIGS. 14A through 14C show cross-sectional views of a method of packaging semiconductor devices in accordance with another embodiment.
Figure 14B:
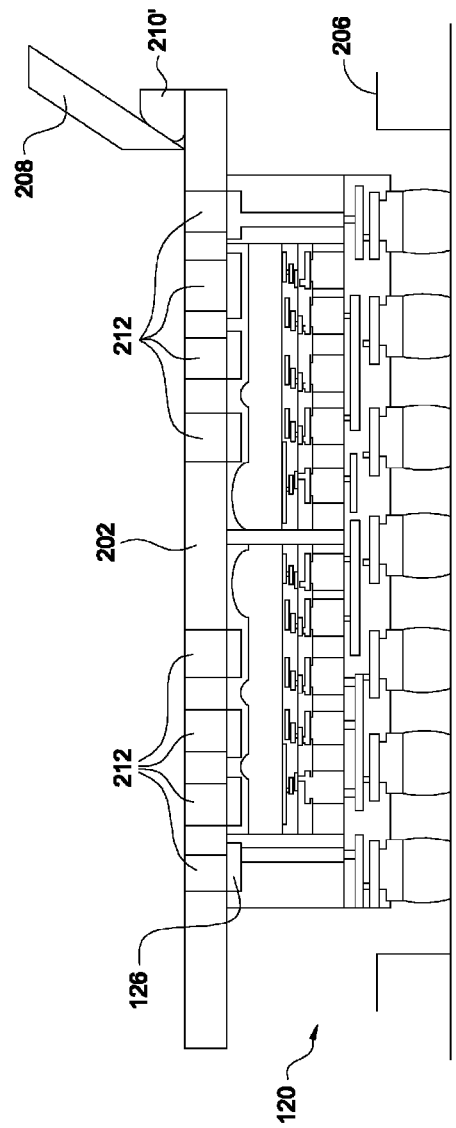
Figure 14C:
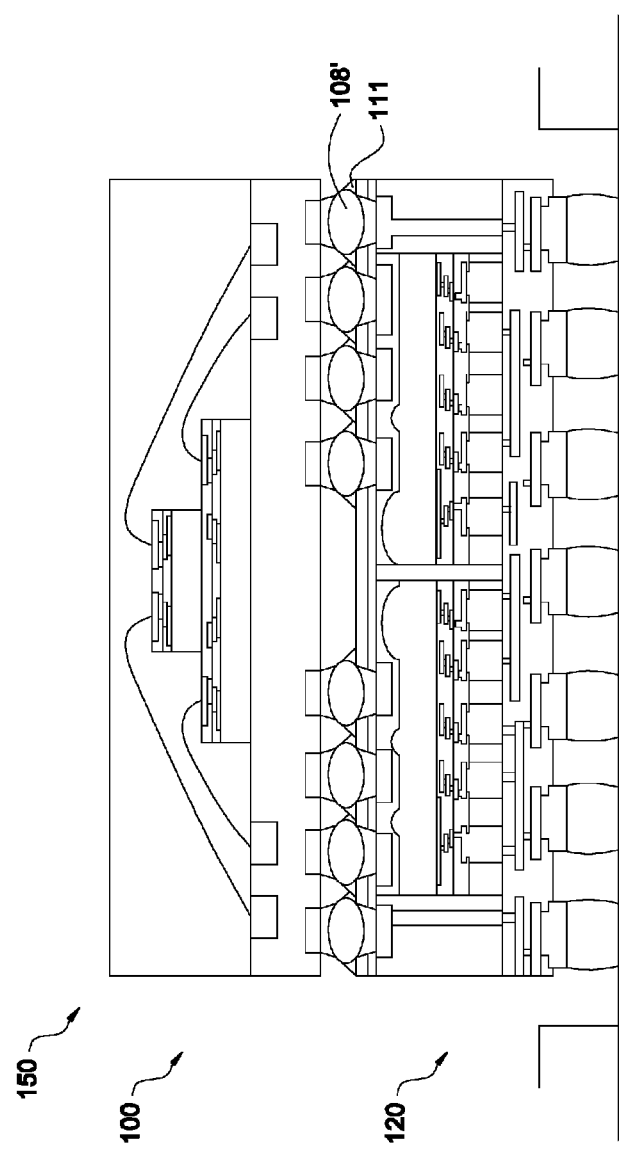

FIGS. 14A through 14C show a cross-sectional view of a method of packaging semiconductor devices similar to the semiconductor device 150 in FIG. 13 in accordance with another embodiment. Details regarding this embodiment that are similar to those for the previously described embodiments will not be repeated herein. In this embodiment, the partially packaged die 120 is formed as described in FIG. 13 above and is placed on a structure 206, such as a carrier wafer.

Referring to FIG. 14A, the application of an epoxy solder paste 210 to the backside of the partially packaged die 120 is illustrated. The epoxy solder paste 210 may be screen printed using a stencil 202, such as a metal stencil, with openings 204 over the contacts 126, and a squeegee blade 208. The epoxy solder paste include tin, silver, bismuth, copper, the like, or a combination thereof and an epoxy component. The epoxy component may be similar to the epoxy component described above for the epoxy flux 111 and the details are not repeated herein. In some embodiments, the epoxy component comprises from about 12% to about 13% by weight of the epoxy solder paste 210.

The squeegee blade 208 may be passed over the stencil 202 and its openings 204 as illustrated in FIG. 14B. The squeegee blade 208 forces the epoxy solder paste 210 into the openings 204 forming the epoxy solder paste structures 212 in the openings 204 and the remaining epoxy solder paste 210' remains on the stencil 202. The squeegee blade 208 may be passed over the stencil 202 and its openings 204 a single time or multiple times. After the epoxy solder paste structures 212 are formed, the stencil 202 is removed and a reflow process may be performed to shape the epoxy solder paste structures 212 into, for example, epoxy solder balls.

FIG. 14C illustrates the packaged semiconductor device 150 after the partially packaged die 100 is attached to the partially packaged die 120 of FIG. 14B. This structure may be similar to the packaged semiconductor device 150 described above in FIG. 13. The solder joints 108' formed between the partially packaged dies 100 and 120 have the epoxy flux 111 surrounding portions of them as described above in FIGS. 3 and 4A through 4D. In an embodiment, the solder balls 108 are not formed on the partially packaged die 100 and the solder joints 108' and the epoxy flux 111 are formed from only the epoxy solder paste structures 212. In another embodiment, the solder balls 108 are formed on the partially packaged die 100 and the solder joints 108' and the epoxy flux 111 are formed from both the solder balls 108 and the epoxy solder paste structures 212. In some embodiments, the solder balls 108 are coated with the epoxy flux 111 (see FIG. 2) and the epoxy flux structure 111 in FIG. 14C is from both the epoxy flux 111 on the solder balls 108 and the epoxy component in the epoxy solder paste structures 212. In other embodiments, the solder balls 108 are not coated with the epoxy flux 111 and the epoxy flux structure 111 in FIG. 14C is from the epoxy component of the epoxy solder paste structures 212.

In the embodiments including both the solder balls 108 and the epoxy solder paste structures 212, the solder balls 108 and the epoxy solder paste structures 212 can have different reflow (melting) temperatures. For example, the solder balls 108 can have a reflow temperature of about 220° C., while tin-bismuth epoxy solder paste structures 212 can have a reflow temperature of about 150° C. Hence, the reflow temperature to form the solder joints 108' can be lower (e.g. less than 220° C. to about 150° C.) in the embodiments including tin-bismuth epoxy solder paste structures 212. This reduced reflow temperature can reduce warpage of the packaged semiconductor device 150.

FIGS. 15A through 15D show a cross-sectional view of a method of packaging semiconductor devices similar to the semiconductor device 150 in FIG. 13 in accordance with another embodiment. Details regarding this embodiment that are similar to those for the previously described embodiments will not be repeated herein. In this embodiment, the solder balls 108 are "coined" or flattened to reduce the gap between the partially packaged dies 100 and 120.

Figure 15A:
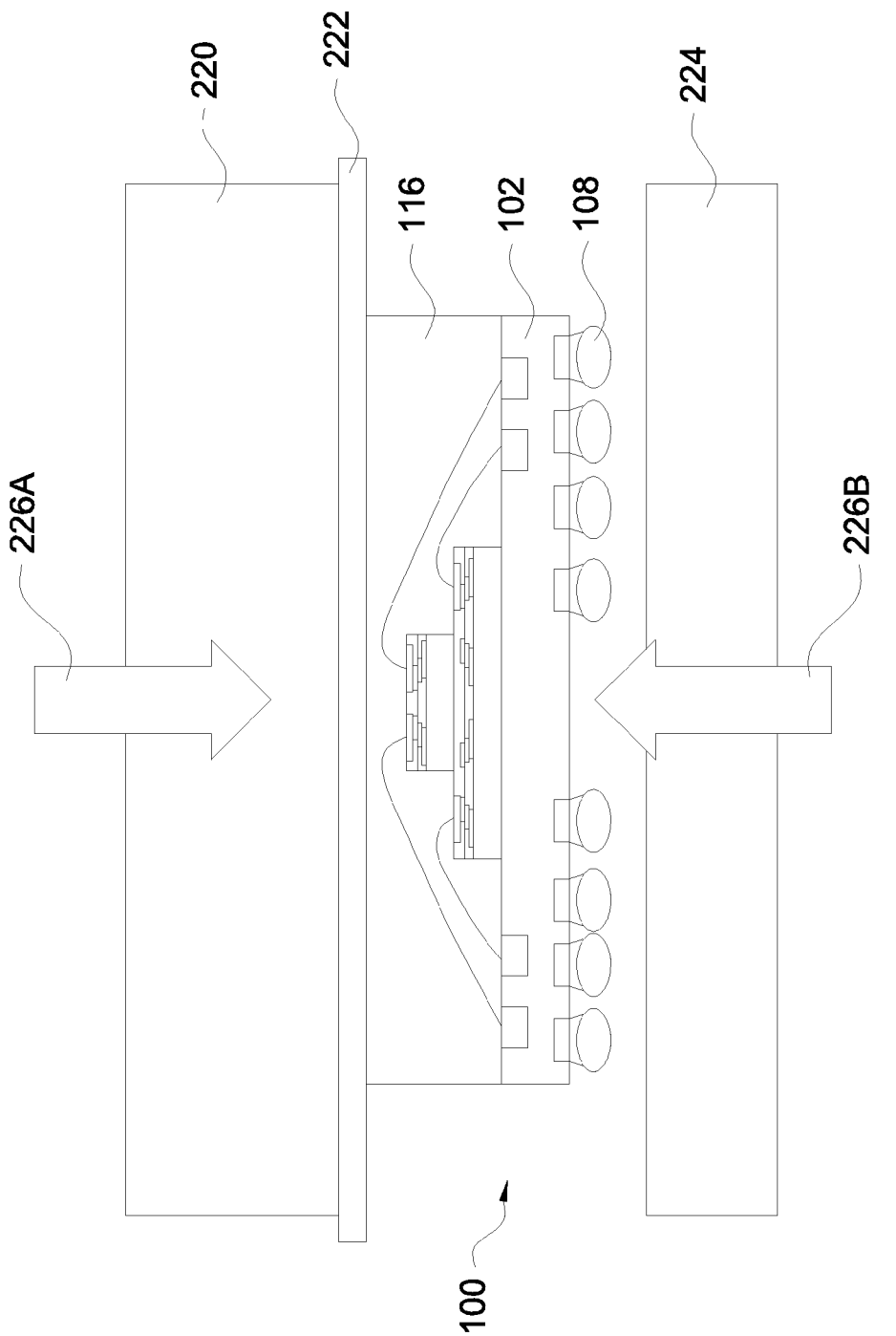
FIGS. 15A through 15D show cross-sectional views of a method of packaging semiconductor devices in accordance with another embodiment.

Referring to FIG. 15A, the partially packaged die 100 is illustrated in a coining apparatus. The coining apparatus includes pressure plates 220 and 224 and an optional release film 222. The coining process includes applying a pressure to one or both of the pressure plates 220 and 224 for a period of time to flatten a surface of the solder balls 108. The pressure plates 220 and 224 are pressed or forced by a ram or other mechanism in opposing directions, as indicated by the arrows 226A and 226B of FIG. 15A. In some embodiments, these opposing directions are substantially perpendicular to the major surfaces of the substrate 102. In an embodiment, only one of the two pressure plates 220 and 224 moves while the other is stationary.

After the coining process, the coined solder balls 108 may be coated in epoxy flux 111. The coating process can be performed as described above in FIG. 2.

Figure 15B:
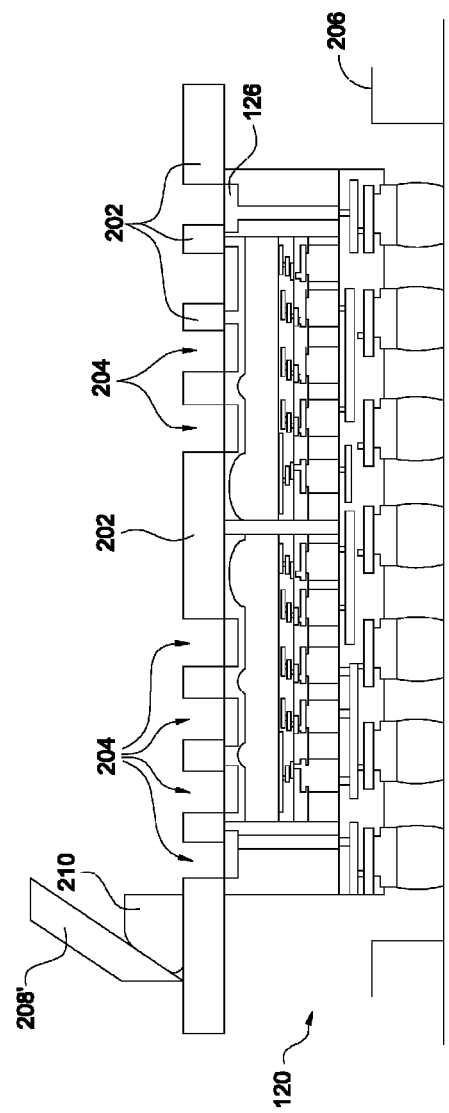
Figure 15C:
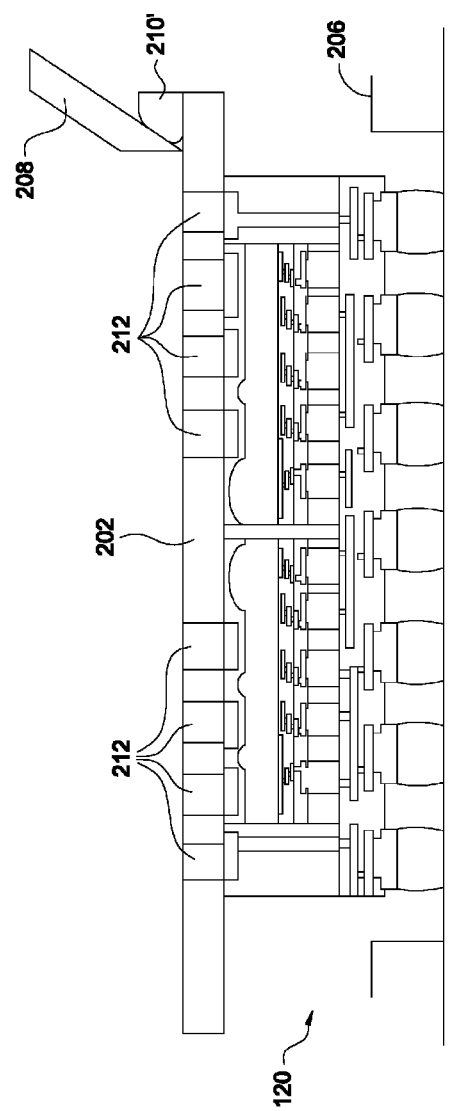
Figure 15D:
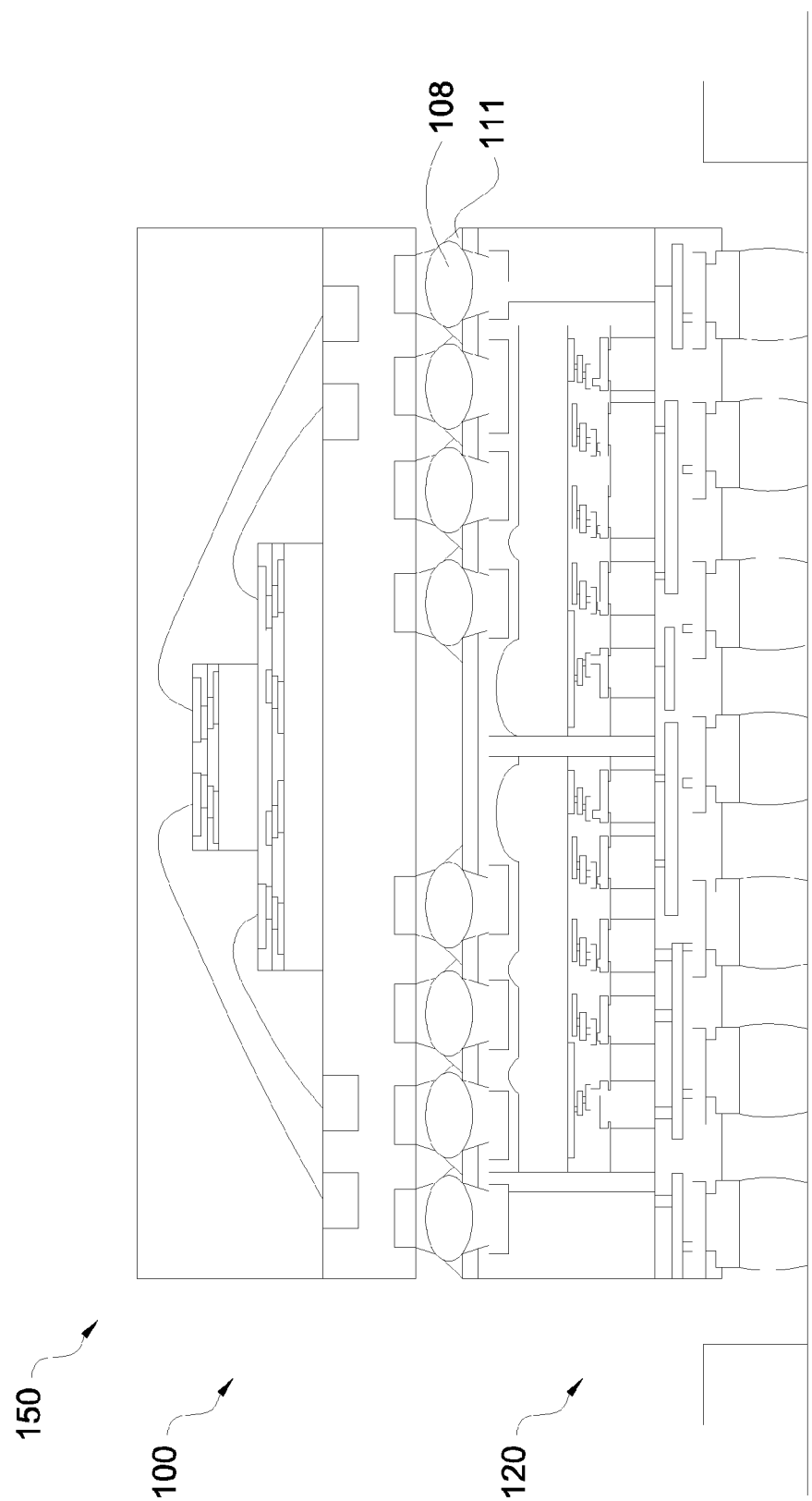

FIGS. 15B and 15C illustrate the application of the epoxy solder paste 210 to form epoxy solder paste structures 212. This process may be similar to the process described above in FIGS. 14A and 14B and the description is not repeated herein. FIG. 15D illustrates the packaged semiconductor device 150 after the partially packaged die 100 is attached to the partially packaged die 120 of FIG. 15C. This structure may be similar to the packaged semiconductor device 150 described above in FIGS. 13 and 14C except that the gap between the partially packaged dies 100 and 120 may be smaller due to the coined solder bumps 108.

Although not illustrated, the embodiments in FIGS. 13 through 15D may include underfill formed between the partially packaged dies 100 and 120 and surrounding the solder joints 108' and epoxy flux 111. The underfill may be similar to the underfill 118 described above.

Figure 16A:
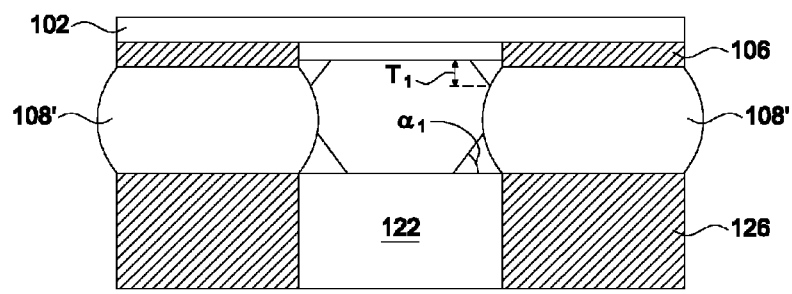
FIGS. 16A and 16B illustrate detailed cross-sectional views of solder joint regions of FIGS. 13, 14C, and 15D, showing an epoxy disposed on the solder joints in accordance with embodiments.
Figure 16B:
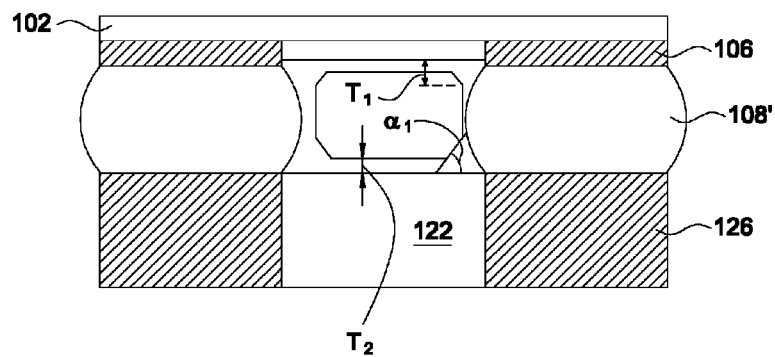

FIGS. 16A and 16B illustrate detailed cross-sectional views of solder joint regions of FIGS. 13, 14C, and 15D, showing an epoxy flux disposed on the solder joints in accordance with embodiments. FIG. 16A illustrates an embodiment with the epoxy flux 111 after the formation of the solder joints 108' remaining around the solder joints 108'. In some embodiments, the epoxy flux 111 only remains in corners adjacent the substrates 102 and 122 and the solder joints 108' as illustrated in FIG. 16A. In these embodiments, a central portion of the sidewall of the solder joint 108's is exposed through the remaining epoxy flux 111. In an embodiment, the outer sidewall of the epoxy flux 111 has an angle $\alpha_1$ relative to major surfaces of the substrates 102 and 122. The angle $\alpha_1$ may be from about 40 degrees to about 60 degrees. The remaining epoxy flux 111 may have a thickness $T_1$ in the corners of the solder joints 108' from surfaces of the substrates 102 and 122. In an embodiment, the thickness $T_1$ is from about 30 μm to about 60 μm.

FIG. 16B illustrates an embodiment with the remaining epoxy flux 111 covering the sidewalls of the solder joints 108'. In this embodiment, a central portion of the solder joint 108's is covered by the remaining epoxy flux 111. In an embodiment, the outer sidewall in the corners of the solder joints 108' of the epoxy flux 111 has the angle $\alpha_1$ relative to major surfaces of the substrates 102 and 122. The angle $\alpha_1$ may be from about 40 degrees to about 60 degrees. The remaining epoxy flux 111 have the thickness $T_1$ in the corners of the solder joints 108' from surfaces of the substrates 102 and 122 and a thickness $T_2$ along the substrates 102 and 122. In an embodiment, the thickness $T_1$ is from about 30 μm to about 60 μm and the thickness $T_2$ is from about 10 μm to about 40 μm.

Figure 17A:
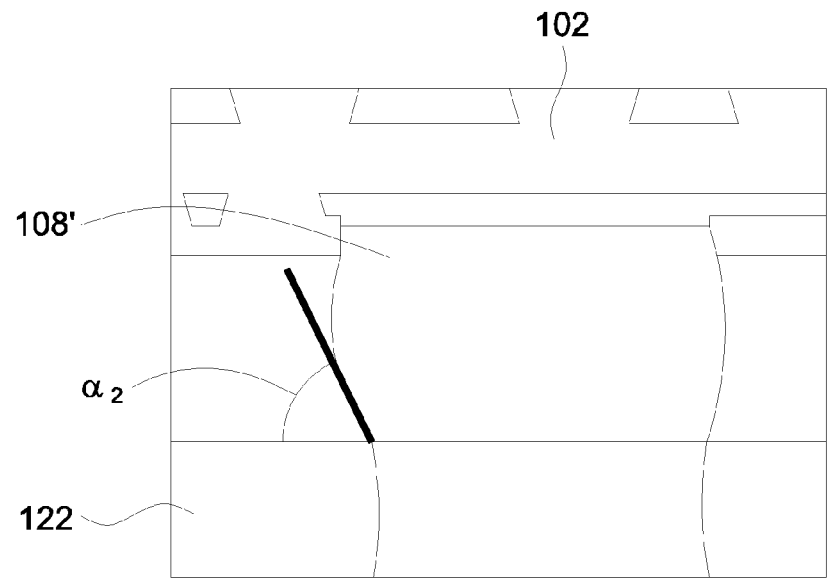
FIGS. 17A and 17B illustrate detailed cross-sectional views of scanning electron microscope (SEM) images of solder joint regions showing an epoxy disposed on the solder joints in accordance with embodiments.
Figure 17B:
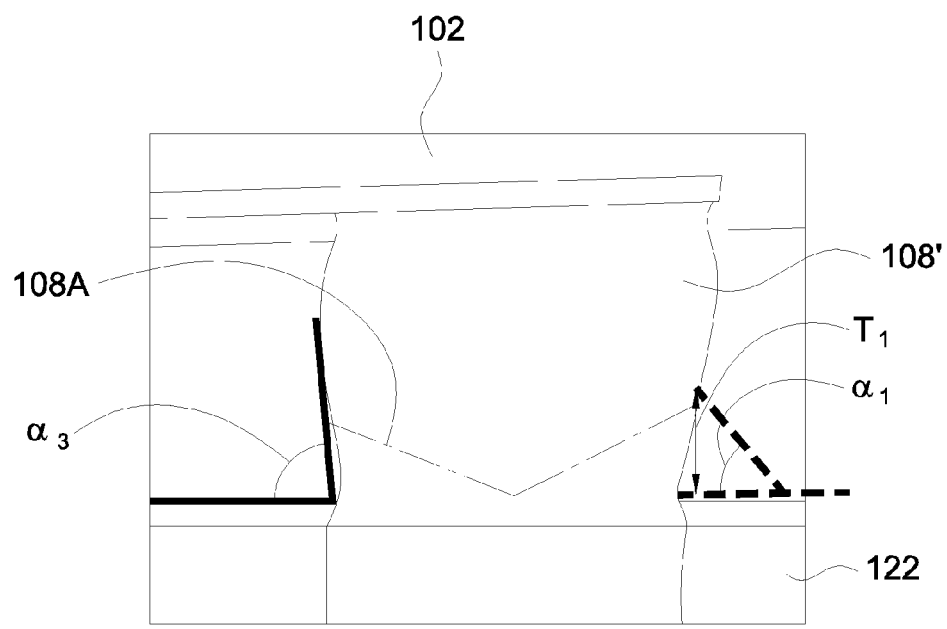

FIGS. 17A and 17B illustrate detailed cross-sectional views of scanning electron microscope (SEM) images of solder joint regions showing an epoxy disposed on the solder joints in accordance with embodiments. FIG. 17A illustrates an embodiment where the solder joints 108' are formed by the solder balls 108 and no epoxy solder paste structures 212. In this embodiment, the solder joint 108' has a sidewall angle $\alpha_2$ relative to major surfaces of the substrates 122 and 102. FIG. 17B illustrates an embodiment where the solder joints 108' are formed by both the solder balls 108 and the epoxy solder paste structures 212. In this embodiment, the solder joint 108' has a sidewall angle $\alpha_3$ relative to major surfaces of the substrates 122 and 102. In some embodiments, the angle $\alpha_3$ is substantially perpendicular to the major surfaces of the substrates 102 and 122. In an embodiment, the angle $\alpha_3$ is greater than the angle $\alpha_2$. In an embodiment, the angle $\alpha_2$ is about 60 degrees and the angle $\alpha_3$ is about 90 degrees.

Referring to FIG. 17B, the solder joint 108' includes a line 108A indicating an approximate demarcation line of bismuth concentration diffusion from the epoxy solder structure 212 into the solder ball 108 of the solder joint 108'. The lower portion of the solder joint 108' has a higher concentration of bismuth than the upper portion of the solder joint 108'. In an embodiment, the bismuth-rich region of the solder joint 108' includes about the lower one fourth to about the lower one third of the solder joint 108'.

Figure 18:
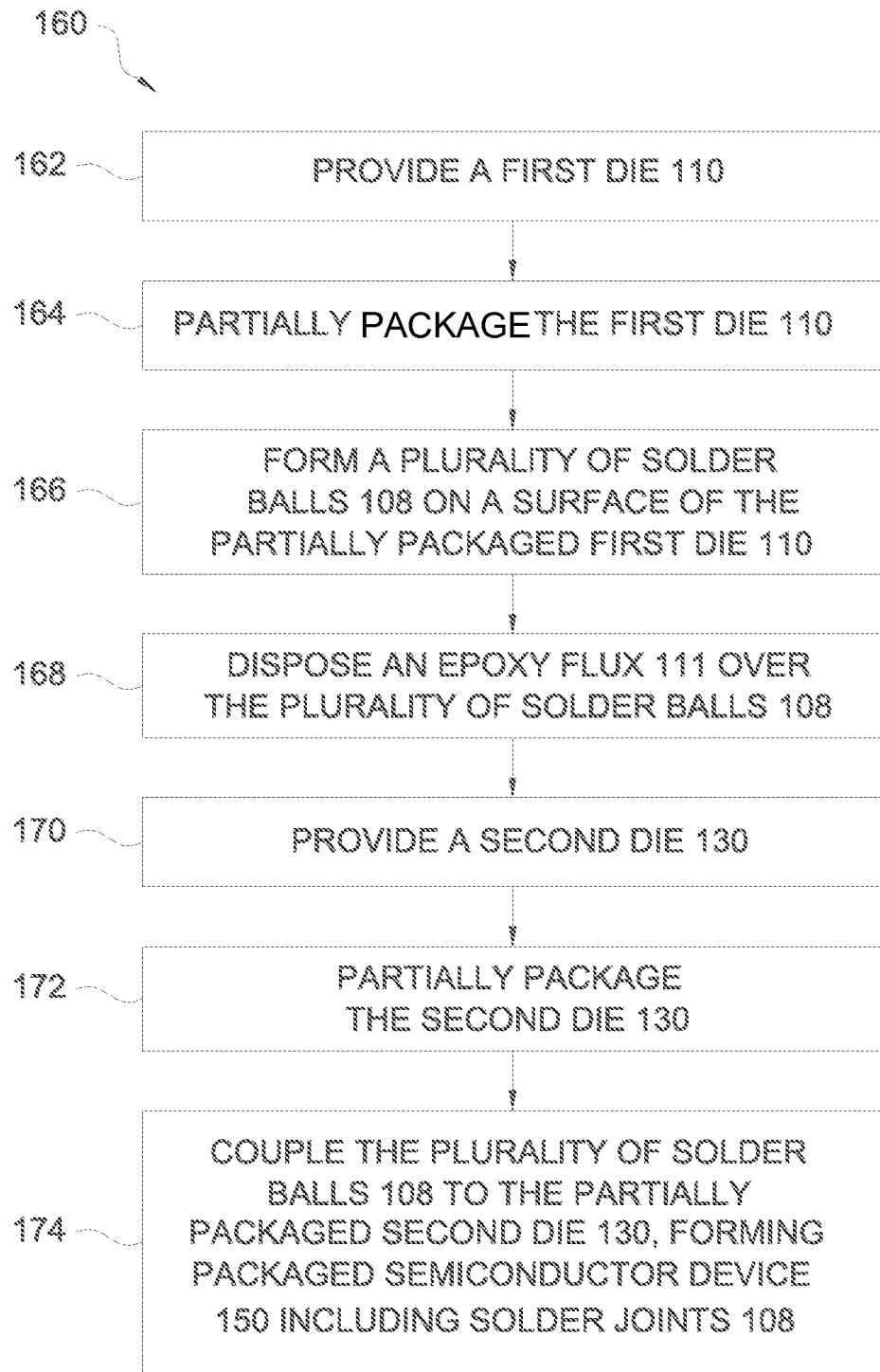
FIG. 18 is a flow chart of a packaging method in accordance with an embodiment of the present disclosure.

FIG. 18 is a flow chart 160 of a packaging method in accordance with an embodiment of the present disclosure. The method includes providing a first die 110 (step 162), partially packaging the first die 110 (step 164), and forming a plurality of solder balls 108 on a surface of the partially packaged first die 110 (step 166). An epoxy flux 111 is disposed over the plurality of solder balls 108 (step 168). The method includes providing a second die 130 (step 170), partially packaging the second die 130 (step 172), and coupling the plurality of solder balls 108 to the partially packaged second die 130 (step 174), forming the packaged semiconductor devices 150 shown in FIGS. 3, 7, 8, 10, and 12 that include solder joints 108'.

Embodiments of the present disclosure include methods of packaging semiconductor devices using the epoxy flux 111, 111', and 111" and also include packaged semiconductor devices 150 that include the epoxy flux 111, 111', and 111".

Advantages of embodiments of the present disclosure include providing novel packaging methods and structures 150 that utilize an epoxy flux 111, 111', or 111" on solder balls 108 and/or 128 used to connect partially packaged dies 100 and 120. Novel package-on-package (PoP) packaging techniques are disclosed that have improved solder joints 108' formed by the solder balls 108 and/or 128 that include the epoxy flux 111, 111', and 111" formed thereon. Joint cracks, which may occur at an interface between solder joints 108' (that comprise the solder ball 108 and/or 128 material) and solder pads (contacts 106 and/or 126), of PoP packages and packaging methods are reduced or prevented by surrounding the solder joints 108' with epoxy material from the epoxy flux 111, 111', and 111" which strengthens the solder connections. At least an epoxy component of the epoxy flux 111, 111', and 111" is left remaining surrounding the solder joints 108' after the solder reflow process, which protects and strengthens the solder joints 108' and also the metal studs 146, if included. The novel packaging methods and structures are easily implementable in packaging and manufacturing process flows.

An embodiment is a method including forming a first package and a second package. The forming the first package includes partially packaging a first die, forming a plurality of solder balls on a surface of the partially packaged first die, and coating the plurality of solder balls with an epoxy flux. The forming the second package includes forming a first electrical connector over a carrier wafer, attaching a second die adjacent the first electrical connector and over the carrier wafer, forming an interconnect structure over the first die and the first electrical connector, the interconnect structure being a frontside of the second package, forming a second electrical connector over the interconnect structure, the second electrical connector being coupled to both the first die and the first electrical connector, and removing the carrier wafer to expose a backside of the second package, the backside being opposite the frontside. The method further includes bonding the first package to the backside of the second package with the plurality of solder balls forming a plurality of solder joints, each of the plurality of solder joints being surrounded by the epoxy flux.

An embodiment is a method including packaging a first die to form first package, forming a plurality of solder balls on a surface of the first package, forming an epoxy flux on the plurality of solder balls, packaging a second die to form a second package, the packaging the second die comprising forming a first through package via (TPV) extending through the second package, the first TPV having a first surface being substantially coplanar with a backside surface of the second die and a second surface substantially coplanar with an active surface of the second die, and coupling the plurality of solder balls to the second package forming a plurality of solder joints surrounded by epoxy flux, at least one of the solder joints being directly coupled to the first surface of the first TPV.

A further embodiment a semiconductor package including a first die coupled to a first substrate, a second die encapsulated in a molding compound, a plurality of solder joints coupled between the first substrate and the second die, each of the plurality of solder joints having a lower portion and an upper portion in a cross-sectional view, the lower portions having higher concentrations of bismuth than the upper portions, and an epoxy layer on and surrounding at least the lower portion of the plurality of solder joints.

Although embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a first package comprising:
      partially packaging a first die;
      forming a plurality of solder balls on a surface of the partially packaged first die; and coating the plurality of solder balls with an epoxy flux;
forming a second package comprising:
  forming a first electrical connector over a carrier wafer;
  attaching a second die adjacent the first electrical connector and over the carrier wafer;
  forming an interconnect structure over the second die and the first electrical connector, the interconnect structure being a frontside of the second package;
  forming a second electrical connector over the interconnect structure, the second electrical connector being coupled to both the second die and the first electrical connector; and
  removing the carrier wafer to expose a backside of the second package, the backside being opposite the frontside; and
bonding the first package to the backside of the second package with the plurality of solder balls forming a plurality of solder joints, each of the plurality of solder joints being surrounded by the epoxy flux.

2. The method of claim 1, wherein the epoxy flux has a greater thickness adjacent the plurality of solder joints proximate the first package and the second package than proximate a central region of the plurality of solder joints.

3. The method of claim 1, wherein the coating the plurality of solder balls with the epoxy flux comprises an epoxy flux that includes a filler material.

4. The method of claim 1, wherein the coating the plurality of solder balls with the epoxy flux comprises jet-spraying the epoxy flux on the plurality of solder balls after the forming the plurality of solder balls on the surface of the partially packaged first die.

5. The method of claim 1, wherein the forming the first package further comprises:
coining the plurality of solder balls forming exposed flat surfaces on each of the plurality of solder balls.

6. The method of claim 1, wherein the forming the second package further comprises encapsulating the second die and the first electrical connector with a molding material, the first electrical connector extending through the molding material from the backside to the frontside of the second package, and wherein the second electrical connector is a metal bump.

7. The method of claim 1, wherein the forming the second package further comprises:
screen printing an epoxy solder paste over the backside of the second package to form a plurality of epoxy solder paste structures, a first one of the plurality of epoxy solder paste structures directly contacting a surface of the first electrical connector.

8. The method of claim 7, wherein the bonding the first package to the backside of the second package further comprises bonding the plurality of solder balls to the plurality of epoxy solder paste structures forming the plurality of solder joints.

9. The method of claim 8, wherein sidewalls of the plurality of solder joints are substantially perpendicular to the backside of the second package.

10. The method of claim 7, wherein the epoxy solder paste comprises tin, bismuth, and an epoxy component.

11. The method of claim 1, further comprising forming an underfill material disposed between the first package, the second package, and the epoxy flux surrounding the plurality of solder joints, the underfill material having a different material composition than the epoxy flux.

12. A method comprising:
packaging a first die to form a first package;
forming a plurality of solder balls on a surface of the first package;
forming an epoxy flux on the plurality of solder balls;
packaging a second die to form a second package, the packaging the second die comprising forming a first through package via (TPV) extending through the second package, the first TPV being laterally spaced from the second die, the first TPV having a first surface substantially coplanar with a backside surface of the second die and a second surface substantially coplanar with an active surface of the second die; and
coupling the plurality of solder balls to the second package forming a plurality of solder joints surrounded by epoxy flux, at least one of the solder joints being coupled to the first surface of the first TPV;
wherein each of the plurality of solder joints comprises a metal stud, and a portion of the metal stud directly adjoins the epoxy flux.

13. The method of claim 12, wherein the packaging the second die to form the second package further comprises:
screen printing an epoxy solder paste over the backside surface of the second die and the first surface of the first TPV to form a plurality of epoxy solder paste structures, a first one of the plurality of epoxy solder paste structures directly contacting the first surface of the first TPV.

14. The method of claim 13, wherein the plurality of solder balls have a first reflow temperature and the plurality of epoxy solder paste structures have a second reflow temperature, the second reflow temperature being less than the first reflow temperature, wherein the coupling the plurality of solder balls to the second package comprises reflowing a solder material of the plurality of epoxy solder paste structures at a temperature less than the first reflow temperature.

15. The method of claim 14, wherein the coupling the plurality of solder balls to the second package does not include reflowing a solder material of the plurality of solder balls.

16. The method of claim 12 further comprising an underfill surrounding the epoxy flux on the plurality of solder joints, the underfill having a different material composition than the epoxy flux.

17. A method comprising:
packaging a first die to form a first package;
forming a plurality of solder balls on a surface of the first package;
coating the plurality of solder balls with an epoxy flux;
packaging a second die to form a second package, the packaging the second die comprising:
  forming a first through package via (TPV) extending through an encapsulant of the second package, a first surface of the first TPV being substantially coplanar with a backside surface of the second die and a second surface of the first TPV being substantially coplanar with an active surface of the second die; and
  screen printing an epoxy solder paste over the backside surface of the second die and the first surface of the first TPV to form a plurality of epoxy solder paste structures, a first one of the plurality of epoxy solder paste structures directly contacting the first surface of the first TPV; and
coupling the plurality of solder balls to the second package forming a plurality of solder joints surrounded by epoxy flux, at least one of the solder joints being coupled to the first surface of the first TPV.

18. The method of claim 17, wherein the plurality of solder balls have a first reflow temperature and the plurality of epoxy solder paste structures have a second reflow temperature, the second reflow temperature being less than the first reflow temperature, wherein the coupling the plurality of solder balls to the second package comprises reflowing a solder material of the plurality of epoxy solder paste structures at a temperature less than the first reflow temperature.

19. The method of claim 12, wherein the first TPV extends through an encapsulant of the second package.

* * * * *